(12) United States Patent
Lee et al.

(10) Patent No.: US 11,600,539 B2
(45) Date of Patent: Mar. 7, 2023

(54) DEFECT DETECTION STRUCTURE OF A SEMICONDUCTOR DIE, SEMICONDUCTOR DEVICE INCLUDING THE SAME AND METHOD OF DETECTING DEFECTS IN SEMICONDUCTOR DIE

(71) Applicant: SAMSUNG ELECTRONICS CO., LTD., Suwon-si (KR)

(72) Inventors: Min-Jae Lee, Suwon-si (KR); Sang-Lok Kim, Seoul (KR); Byung-Hoon Jeong, Hwaseong-si (KR); Tae-Sung Lee, Hwaseong-si (KR); Jeong-Don Ihm, Seongnam-si (KR); Jae-Yong Jeong, Yongin-si (KR); Young-Don Choi, Seoul (KR)

(73) Assignee: Samsung Electronics Co., Ltd.

( * ) Notice: Subject to any disclaimer, the term of this patent is extended or adjusted under 35 U.S.C. 154(b) by 8 days.

(21) Appl. No.: 17/356,152

(22) Filed: Jun. 23, 2021

(65) Prior Publication Data
US 2021/0320039 A1 Oct. 14, 2021

Related U.S. Application Data

(63) Continuation of application No. 16/357,674, filed on Mar. 19, 2019, now Pat. No. 11,062,966.

(30) Foreign Application Priority Data

Sep. 18, 2018 (KR) .......................... 10-2018-0111542

(51) Int. Cl.
*G01R 31/64* (2020.01)
*H01L 21/66* (2006.01)
(Continued)

(52) U.S. Cl.
CPC .......... *H01L 22/32* (2013.01); *G01R 31/3187* (2013.01); *H01L 22/14* (2013.01); *H01L 23/528* (2013.01)

(58) Field of Classification Search
CPC ............ G01R 31/2601; G01R 31/2831; G01R 31/2884; G01R 31/2896; G01R 31/307;
(Continued)

(56) References Cited

U.S. PATENT DOCUMENTS 7,247,921 B2 7/2007 Sugiura et al.
7,863,917 B2 1/2011 Park
(Continued)

FOREIGN PATENT DOCUMENTS

JP 2005347651 A 12/2005
JP 2012243910 A 12/2012
(Continued)

OTHER PUBLICATIONS

"Search Report and Written Opinion", SG Application No. 10201908064U, dated Feb. 4, 2022, 8 pp.

*Primary Examiner* — Vinh P Nguyen
(74) *Attorney, Agent, or Firm* — Myers Bigel, P.A.

(57) ABSTRACT

A semiconductor device includes a semiconductor die, a defect detection structure and an input-output circuit. The semiconductor die includes a central region and a peripheral region surrounding the central region. The peripheral region includes a left-bottom corner region, a left-upper corner region, a right-upper corner region and a right-bottom corner region. The defect detection structure is formed in the peripheral region. The defect detection structure includes a first conduction loop in the left-bottom corner region, a second conduction loop in the right-bottom corner region, a third conduction loop in the left-bottom corner region and the left-upper corner region and a fourth conduction loop in
(Continued)

the right-bottom corner region and the right-upper corner region. The input-output circuit is electrically connected to end nodes of the first conduction loop, the second conduction loop, the third conduction loop and the fourth conduction loop.

20 Claims, 32 Drawing Sheets

(51) Int. Cl.
*H01L 23/528* (2006.01)
*G01R 31/3187* (2006.01)

(58) Field of Classification Search
CPC ............... G01R 27/00; G01R 31/2812; G01R 31/2607; G01R 31/2843; G01R 31/2851; G01R 31/2879; G01R 31/3173; G01R 31/31707; H01L 22/34; H01L 22/14; H01L 2224/48247; H01L 24/16; H01L 24/81; H01L 25/0657; H01L 22/12; H01L 23/58; H01L 24/29; H01L 27/3276; H01L 2924/14; H01L 24/45; H01L 2224/16227; H01L 2225/06548; H01L 24/48; H01L 2924/3011; H01L 51/0031; H01L 22/32; H01L 23/528; G01N 33/48721; G01N 27/24; G01N 29/00

See application file for complete search history.

(56) References Cited

U.S. PATENT DOCUMENTS

| | | | |
|---|---|---|---|
| 7,948,249 B2 | 5/2011 | Park | |
| 8,159,254 B2 | 4/2012 | Kaltalioglu | |
| 8,624,401 B2 | 1/2014 | Ishikawa | |
| 8,803,308 B2 | 8/2014 | Ishikawa | |
| 9,070,683 B2 | 6/2015 | Fender et al. | |
| 9,159,646 B2 | 10/2015 | Xie et al. | |
| 9,698,066 B2 | 7/2017 | Lee et al. | |
| 9,768,129 B2 | 9/2017 | Lee et al. | |
| 10,788,528 B2 | 9/2020 | Kwon et al. | |
| 10,811,327 B2 * | 10/2020 | Munder | H01L 22/34 |
| 11,062,966 B2 * | 7/2021 | Lee | H01L 22/32 |
| 11,342,234 B2 * | 5/2022 | Kim | H01L 27/11526 |
| 2012/0261663 A1 | 10/2012 | Tsuji | |
| 2015/0115266 A1 | 4/2015 | Sanchez et al. | |
| 2016/0254200 A1 | 9/2016 | Zundel et al. | |
| 2017/0227597 A1 | 8/2017 | Zettler et al. | |
| 2018/0145002 A1 | 5/2018 | Munder et al. | |

FOREIGN PATENT DOCUMENTS

| | | |
|---|---|---|
| JP | 2013047697 A | 3/2013 |
| JP | 2015232500 A | 12/2015 |
| KR | 100750192 B1 | 8/2007 |
| KR | 20160108930 A | 9/2016 |

* cited by examiner

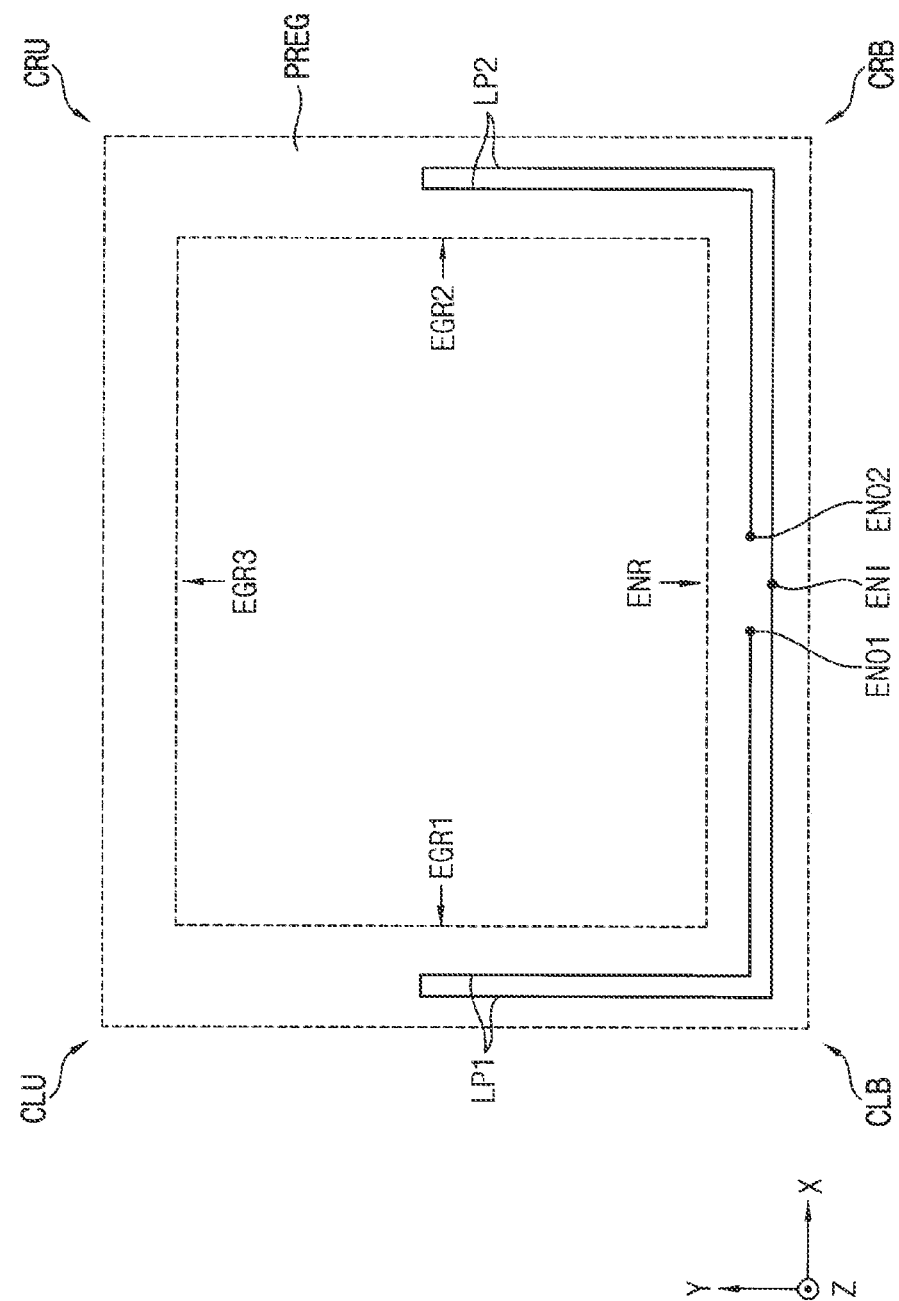

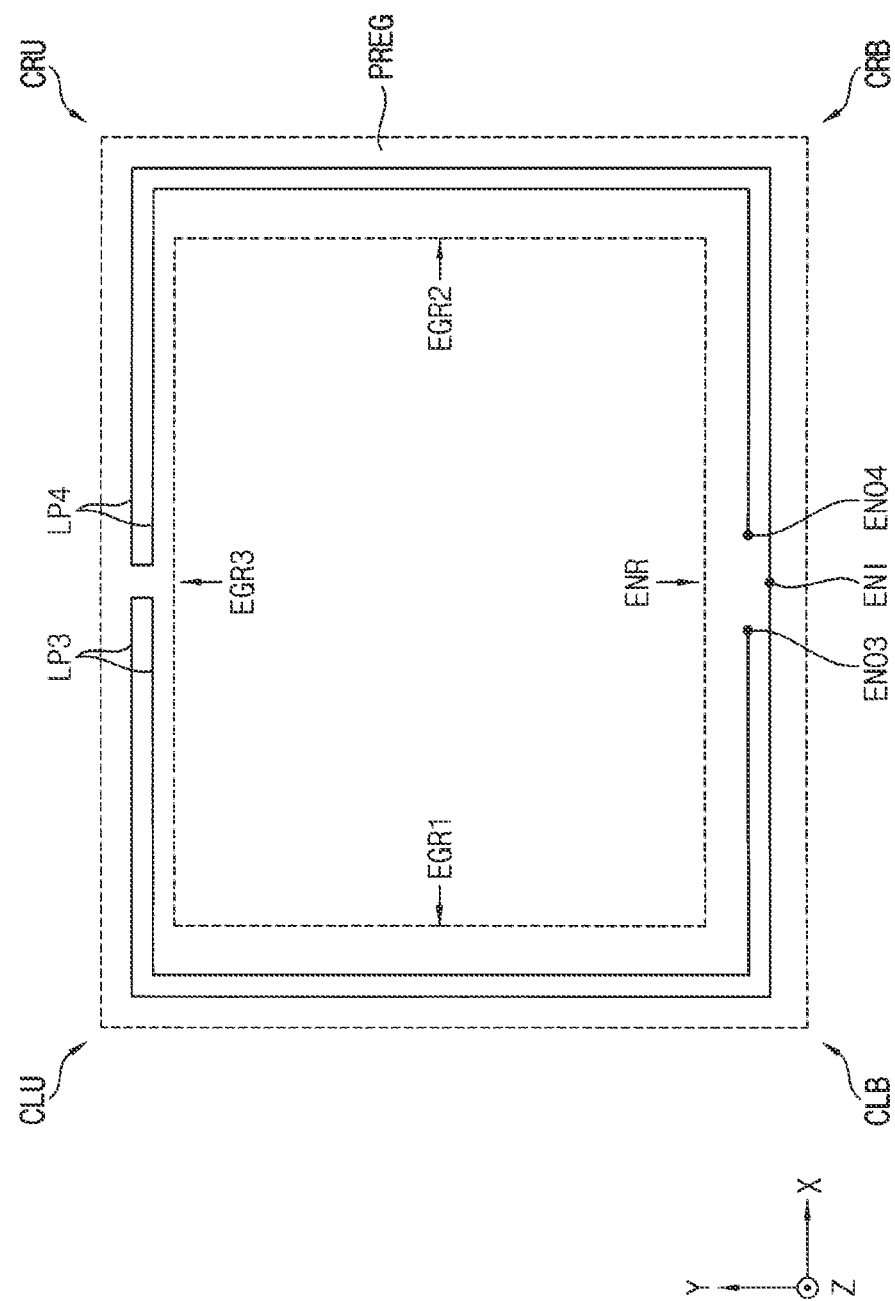

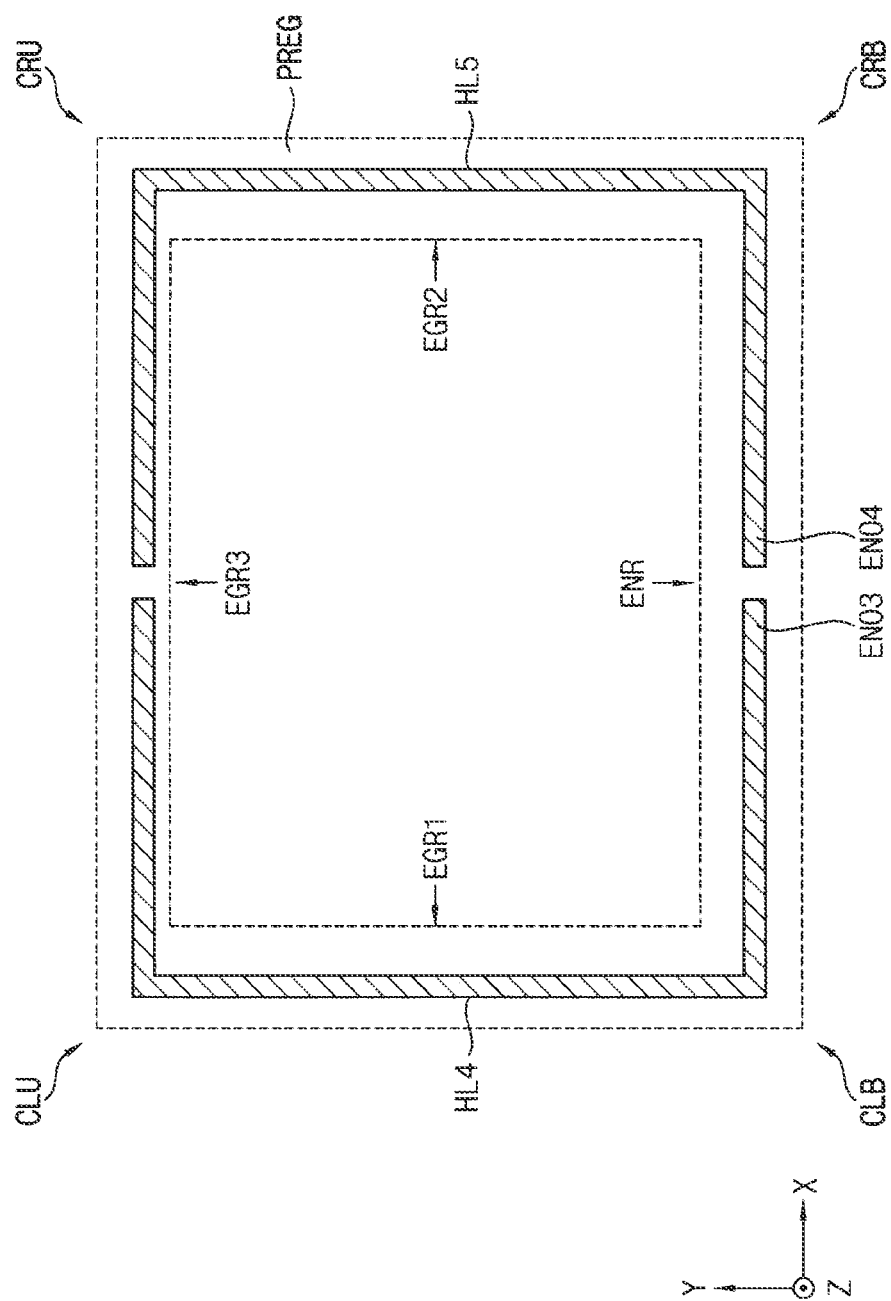

F I G. 6A
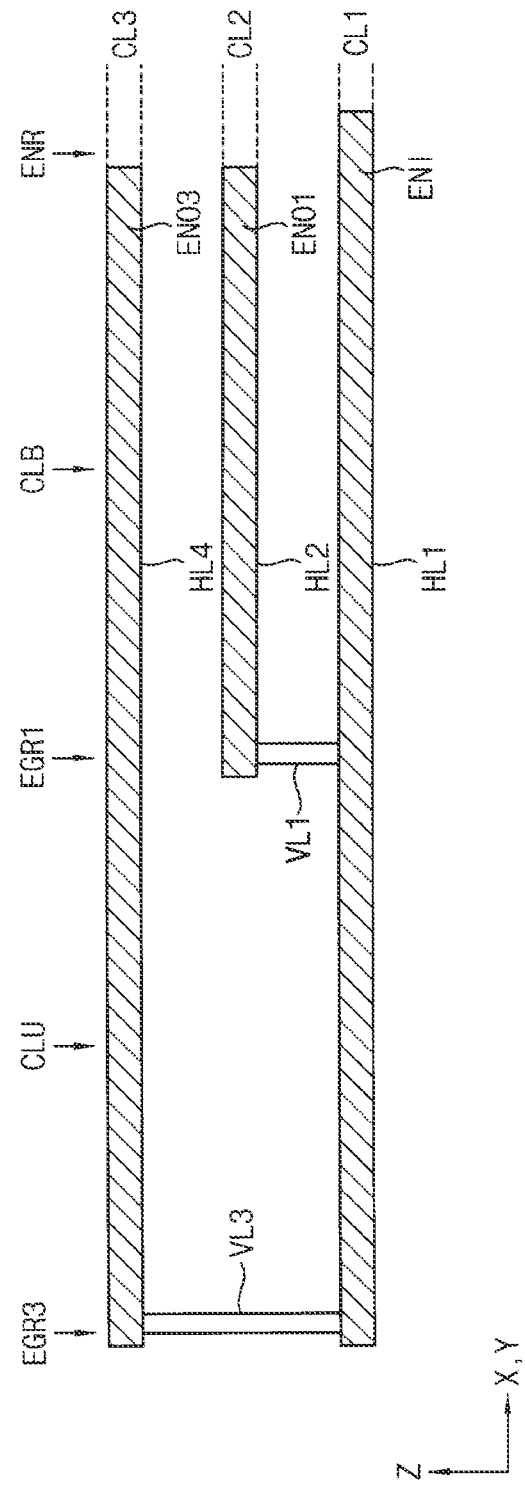

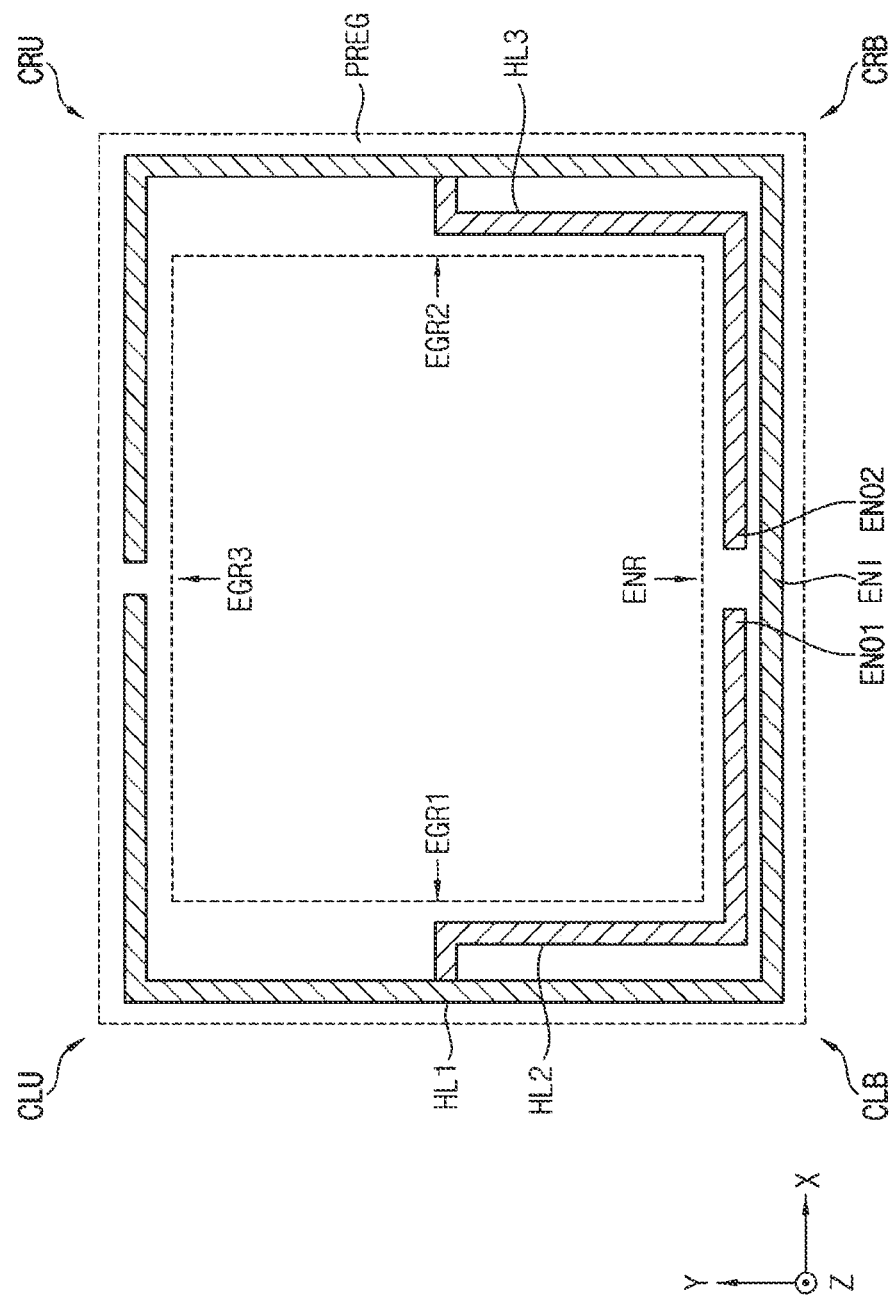

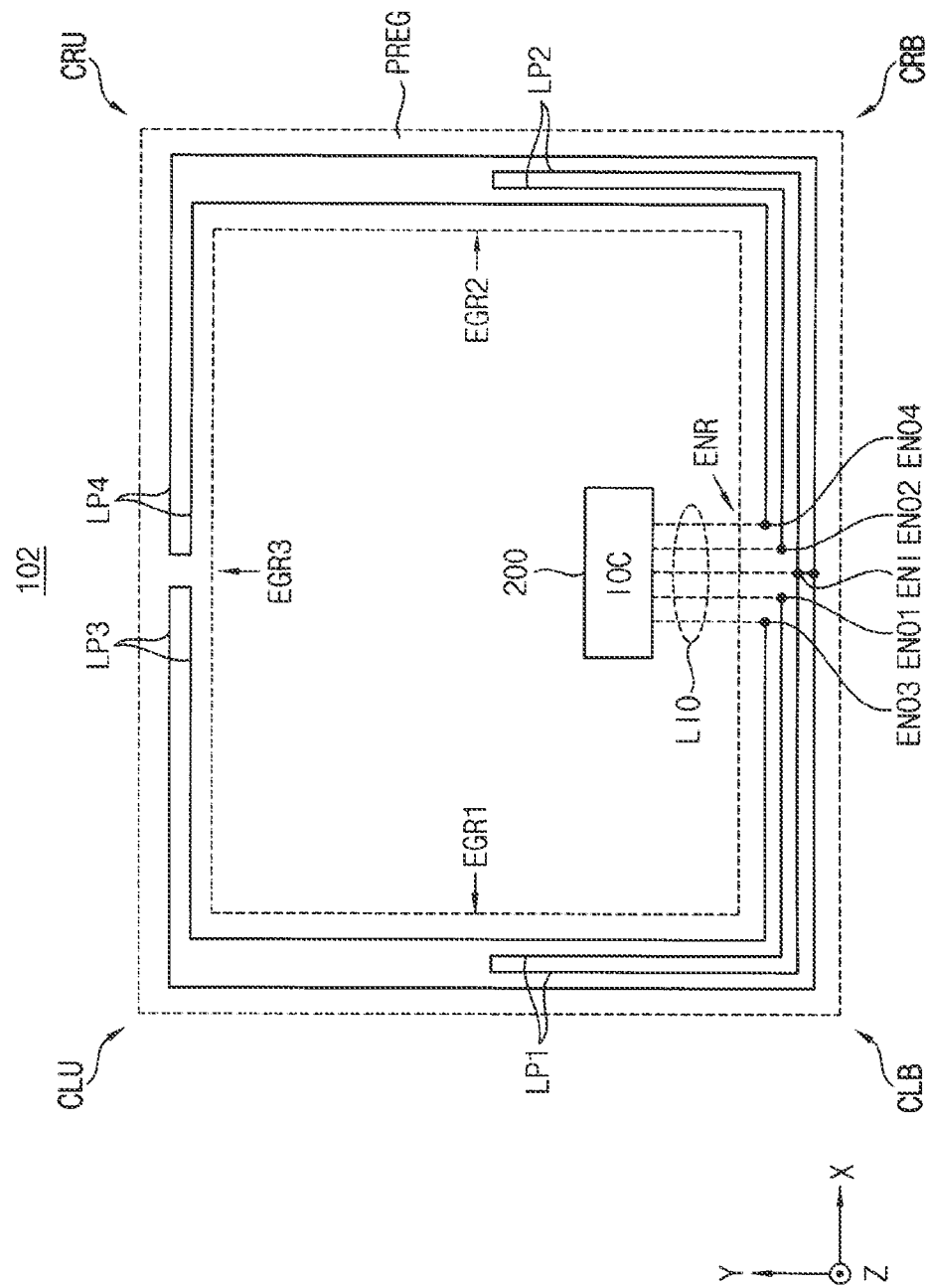

| POSITION | LP1 | LP2 | LP3 | LP4 |
|---|---|---|---|---|
| CR1 | DEL | NOR | DEL | NOR |
| CR2 | NOR | DEL | NOR | DEL |
| CR3 | NOR | NOR | DEL | NOR |
| CR4 | NOR | NOR | NOR | DEL |

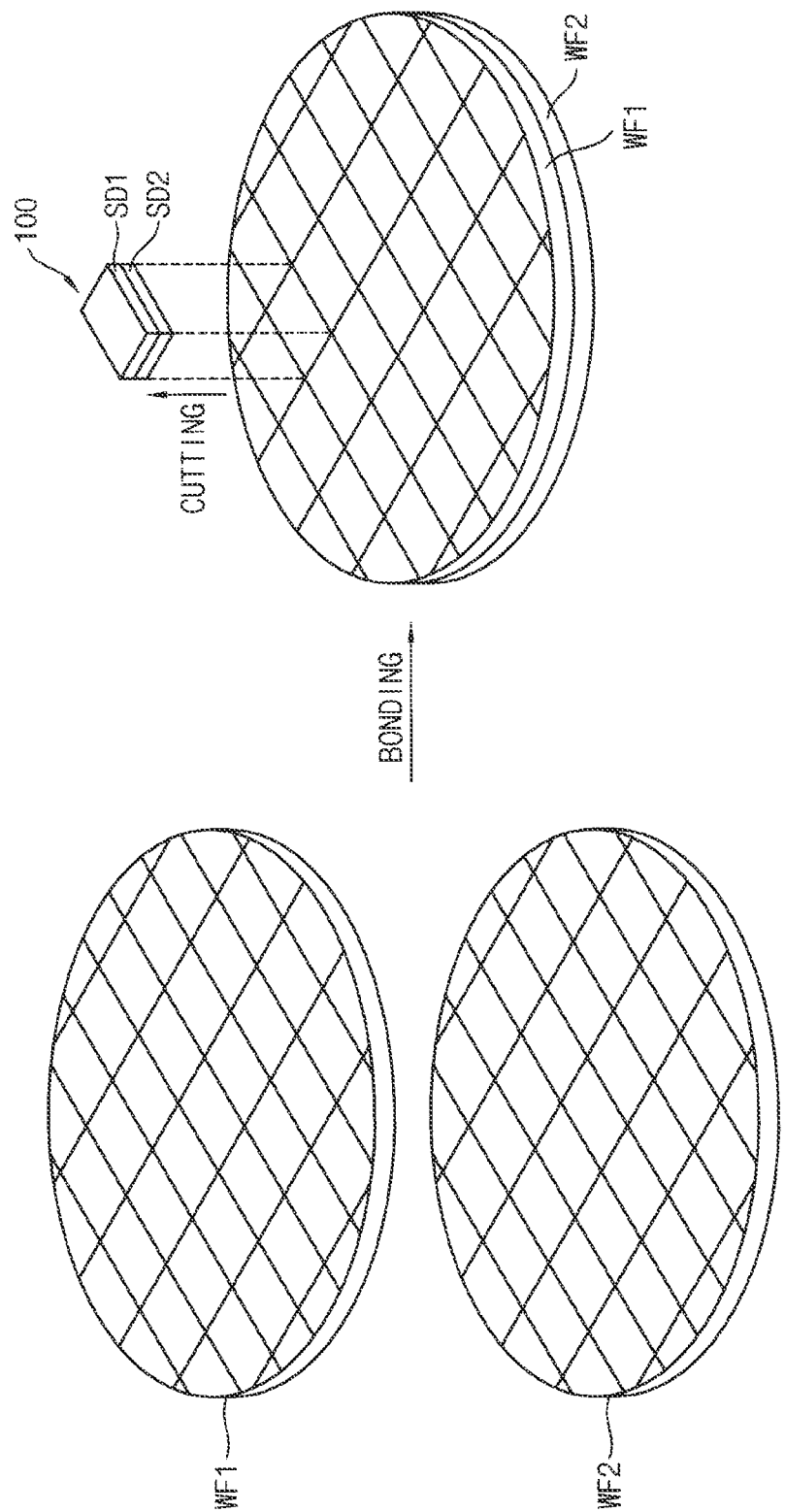

DEFECT DETECTION STRUCTURE OF A SEMICONDUCTOR DIE, SEMICONDUCTOR DEVICE INCLUDING THE SAME AND METHOD OF DETECTING DEFECTS IN SEMICONDUCTOR DIE

CROSS-REFERENCE TO RELATED APPLICATIONS

This U.S. Non-provisional application is a continuation of U.S. patent application Ser. No. 16/357,674, filed Mar. 19, 2019, now U.S. Pat. No. 11,062,966, which itself claims priority under 35 USC § 119 to Korean Patent Application No. 10-2018-0111542, filed on Sep. 18, 2018, in the Korean Intellectual Property Office (KIPO), the disclosures of both of which are incorporated by reference in their entireties herein.

BACKGROUND

Example embodiments relate generally to semiconductor integrated circuits for defect detection.

In general, integrated circuits are manufactured by forming repeated patterns in a wafer of semiconductor material. The wafer may be cut or diced into a plurality of semiconductor dies, and the respective semiconductor die may be packaged into a semiconductor chip. Cracks may occur in the semiconductor die during the cutting and packaging processes. To reduce yield of defective products, the semiconductors are inspected to detect the cracks.

SUMMARY

Example embodiments relate generally to semiconductor integrated circuits, and more particularly to a defect detection structure of a semiconductor die, a semiconductor device including a defect detection structure and a method of detecting defects in a semiconductor die.

Some example embodiments may provide a defect detection structure of a semiconductor die and a semiconductor device including a defect detection structure for enhancing detectability of crack penetration of various types.

Some example embodiments may provide a method of detecting defects in a semiconductor die for enhancing detectability of crack penetration of various types.

According to example embodiments, a semiconductor device includes a semiconductor die, a defect detection structure and an input-output circuit. The semiconductor die includes a central region that includes a semiconductor integrated circuit and a peripheral region surrounding the central region. The peripheral region includes a left-bottom corner region, a left-upper corner region, a right-upper corner region and a right-bottom corner region. The defect detection structure is in the peripheral region. The defect detection structure includes a first conduction loop in the left-bottom corner region, a second conduction loop in the right-bottom corner region, a third conduction loop in the left-bottom corner region and the left-upper corner region and a fourth conduction loop in the right-bottom corner region and the right-upper corner region. The input-output circuit is electrically connected to respective end nodes of the first conduction loop, the second conduction loop, the third conduction loop and the fourth conduction loop.

According to example embodiments, a defect detection structure is in a peripheral region surrounding a central region that includes a semiconductor integrated circuit. The defect detection structure includes a first conduction loop in a left-bottom corner region of the peripheral region, a second conduction loop in a right-bottom corner region of the peripheral region, a third conduction loop in the left-bottom corner region and a left-upper corner region of the peripheral region and a fourth conduction loop in the right-bottom corner region and a right-upper corner region of the peripheral region.

According to example embodiments, a method of detecting defects in a semiconductor die including a central region that includes a semiconductor integrated circuit and a peripheral region surrounding the central region where the peripheral region including a left-bottom corner region, a left-upper corner region, a right-upper corner region and a right-bottom corner region, includes, forming a defect detection structure in the peripheral region such that the defect detection structure includes a first conduction loop in the left-bottom corner region, a second conduction loop in the right-bottom corner region, a third conduction loop in the left-bottom corner region and the left-upper corner region and a fourth conduction loop in the right-bottom corner region and the right-upper corner region, applying a test input signal to an input end node of the defect detection structure, receiving respective first, second, third, and fourth test output signals from first, second, third, and fourth output end nodes of the first through fourth conduction loops and determining existence of defects in the semiconductor die and locations of the defects based on the test input signal and the first, second, third, and fourth test output signals.

The defect detection structure, the semiconductor device and the associated method according to example embodiments may detect crack penetration of various types accurately using the plurality of conduction loops formed in the peripheral region surrounding the central region in which the semiconductor integrated circuit is formed. The defect detection structure, the semiconductor device and the associated method according to example embodiments may prevent or reduce yield of bad products with enhanced detectability of cracks.

BRIEF DESCRIPTION OF THE DRAWINGS

Example embodiments of the present disclosure will be more clearly understood from the following detailed description taken in conjunction with the accompanying drawings.

FIGS. 2A and 2B are diagrams illustrating conduction loops included in a defect detection structure according to example embodiments.

FIGS. 5A, 5B and 5C are top views illustrating layouts of conduction layers of the defect detection structure of FIG. 4, according to example embodiments.

FIGS. 6A and 6B are cross-sectional views illustrating a vertical structure of the defect detection structure of FIG. 4, according to example embodiments.

FIGS. 9A and 9B are top views illustrating layouts of conduction layers of the defect detection structure of FIG. 8, according to example embodiments.

FIG. 11 is a diagram illustrating a semiconductor device according to example embodiments.

FIG. 25 is a diagram for describing manufacturing processes of a stacked semiconductor device according to example embodiments.

DETAILED DESCRIPTION

Figure 1:
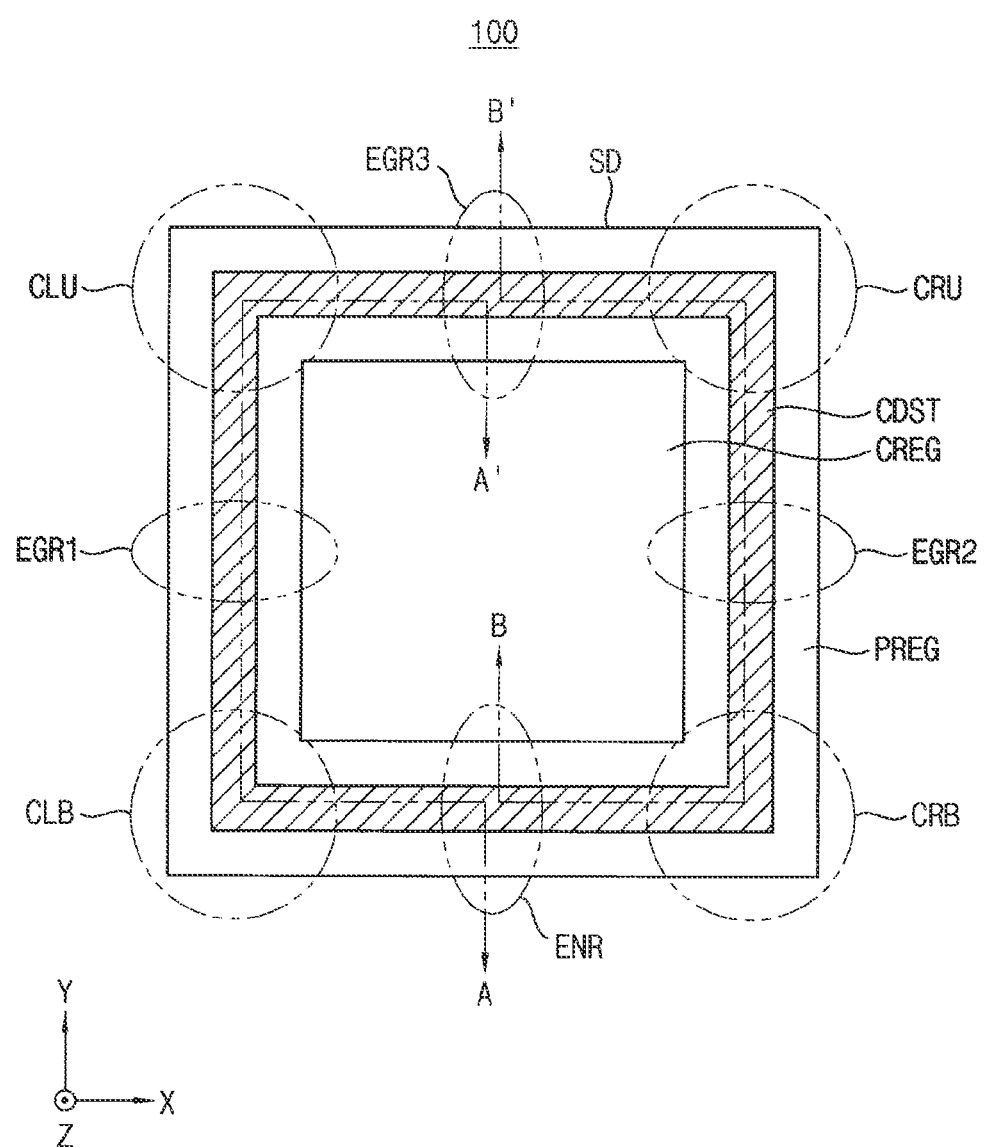
FIG. 1 is a top view illustrating a layout of a semiconductor device according to example embodiments.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. Various example embodiments will be described more fully hereinafter with reference to the accompanying drawings, in which some example embodiments are shown.

In the drawings, like numerals refer to like elements throughout. The repeated descriptions may be omitted.

FIG. 1 is a top view illustrating a layout of a semiconductor device according to example embodiments.

Referring to FIG. 1, a semiconductor device 100 includes at least one semiconductor die SD. The semiconductor die SD includes a central region CREG and a peripheral region PREG surrounding the central region CREG.

Various semiconductor integrated circuits may be formed in the central region CREG depending on a kind or type of the semiconductor device 100. For example, the semiconductor device 100 may be semiconductor memory device and/or a memory integrated circuit illustrated as FIGS. 15 and 16, and may be formed in the central region CREG of the semiconductor die SD.

A defect detection structure CDST, according to example embodiments, for detecting defects such as cracks may be formed in the peripheral region PREG. The defect detection structure CDST may be formed in a plurality of conduction layers disposed in a vertical direction Z that is perpendicular to a row direction and a column direction, and may be formed in a ring-shaped three-dimensional structure in the peripheral region PREG to surround the central region CREG.

Figure 7A:
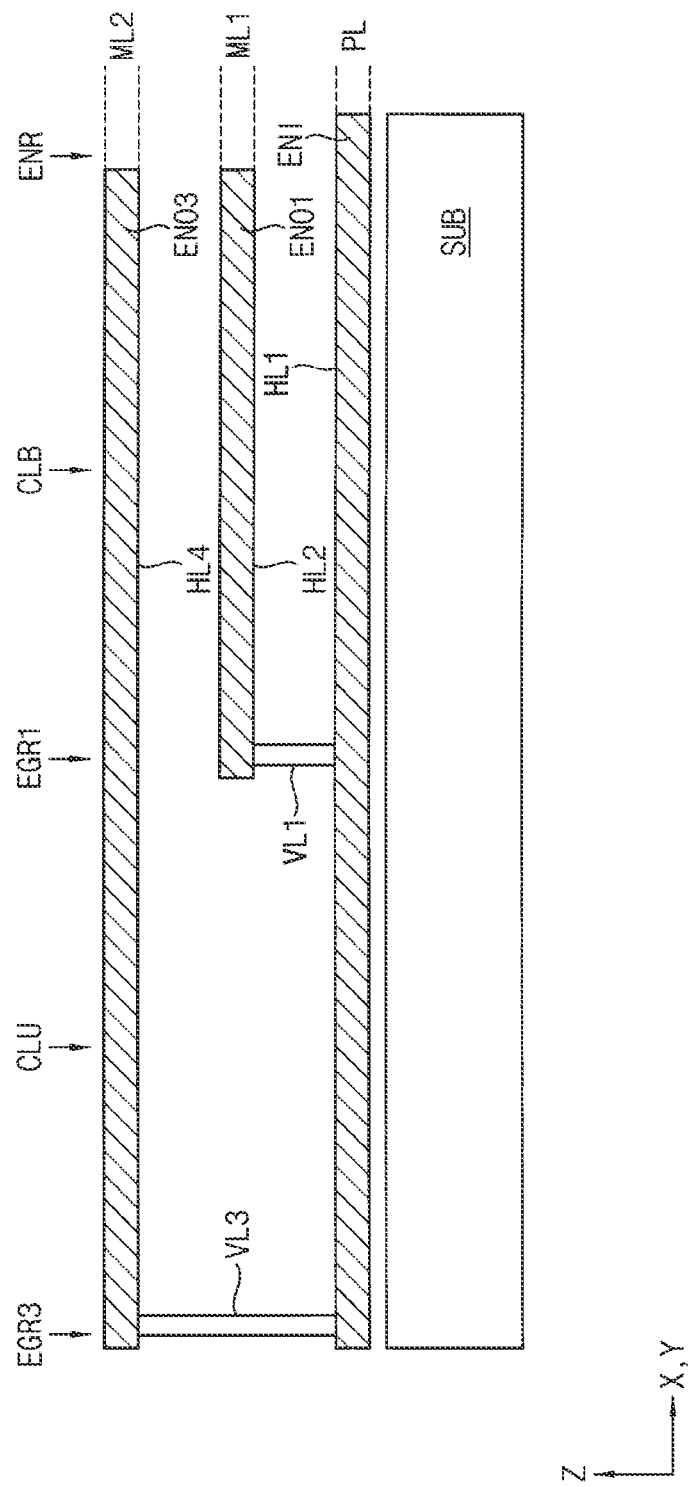
FIGS. 7A and 7B are cross-sectional views illustrating a semiconductor device including the defect detection structure of FIG. 4 according to example embodiments.
Figure 7B:
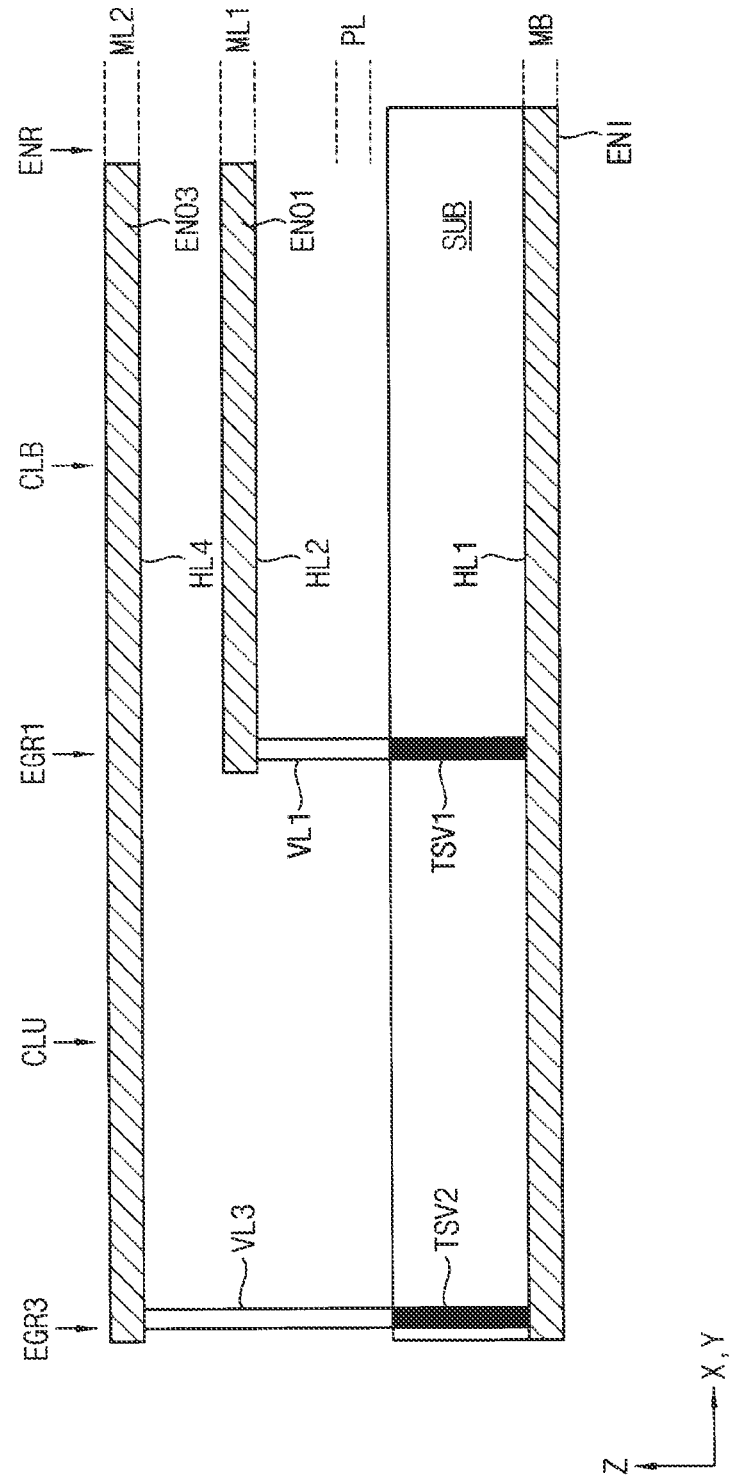

In some example embodiments, the semiconductor device 100 may include a single semiconductor die. In this case, the defect detection structure CDST may be formed using conduction layers within the single semiconductor die as illustrated in FIGS. 7A and 7B.

Figure 26A:
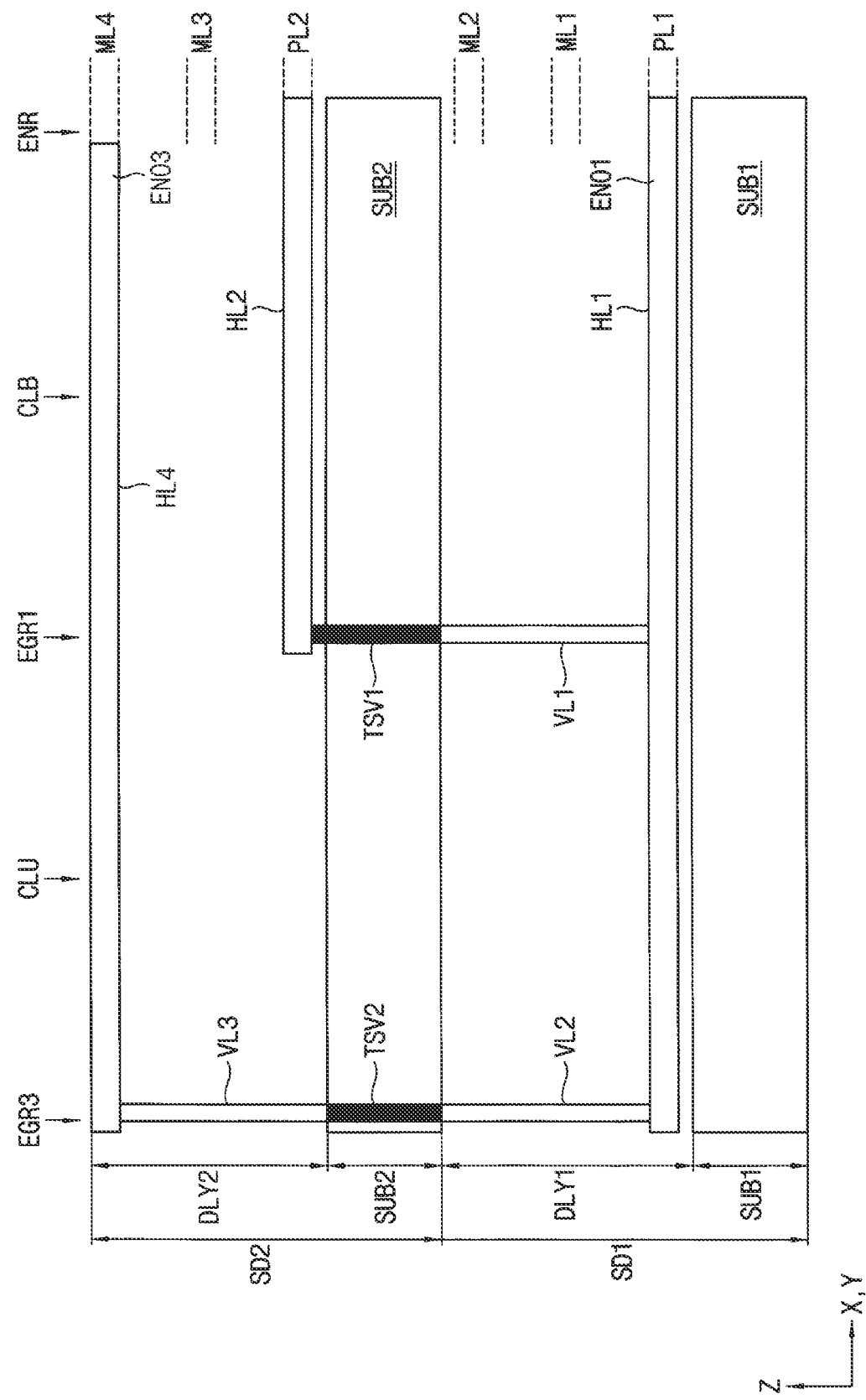
FIGS. 26A and 26B are cross-sectional views illustrating a stacked semiconductor device including a defect detection structure according to example embodiments.
Figure 26B:
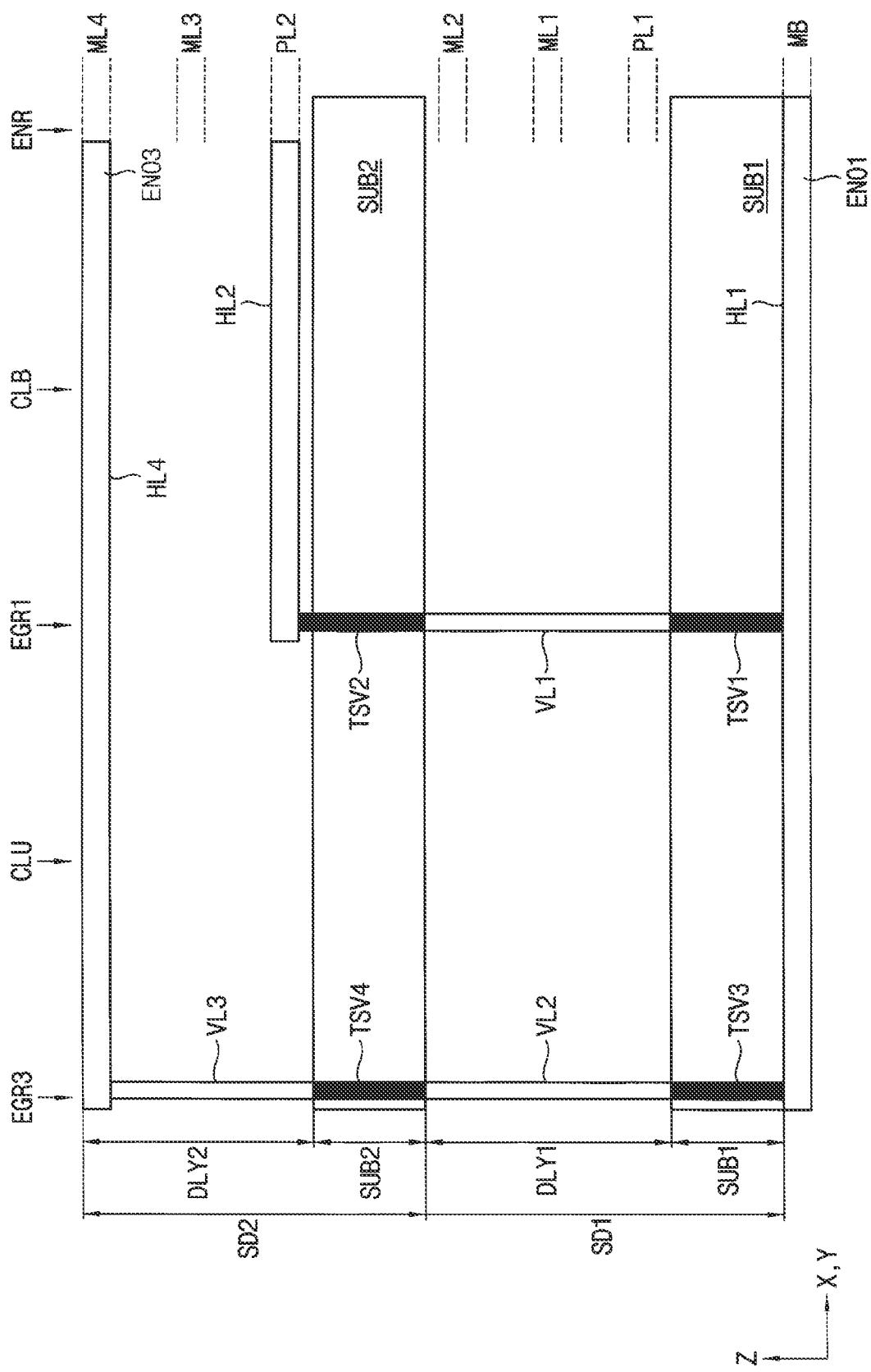

In some example embodiments, the semiconductor device 100 may include a plurality of semiconductor dies. In this case, the defect detection structure CDST may be formed using conduction layers distributed in the plurality of the semiconductor dies as illustrated in FIGS. 26A and 26B.

As will be described below, the defect detection structure CDST may include a first conduction loop, a second conduction loop, a third conduction loop and/or a fourth conduction loop. The first conduction loop passes through a left-bottom corner region CLB of the peripheral region PREG. The second conduction loop passes through a right-bottom corner region CRB of the peripheral region PREG. The third conduction loop passes through the left-bottom corner region CLB and a left-upper corner region CLU of the peripheral region PREG. The fourth conduction loop passes through the right-bottom corner region CRB and a right-upper corner region CRU of the peripheral region PREG. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

The defect detection structure CDST and the semiconductor device 100 including the defect detection structure CDST according to example embodiments may accurately detect crack penetration of various types using the plurality of conduction loops formed in the peripheral region PREG surrounding the central region CREG in which the semiconductor integrated circuit is formed.

Hereinafter, example embodiments are described using an orthogonal set of an X-axis, a Y-axis and a Z-axis for convenience of illustration and description. The X-axis, the Y-axis and the Z-axis are used to three perpendicular directions along the three directions, and are not limited to particular directions. The X direction corresponds to a first horizontal direction or a row direction, the Y direction corresponds to a second horizontal direction or a column direction and the Z direction corresponds to a vertical direction. If exceptional descriptions are not mentioned, the Z direction indicates a vertical direction perpendicular to conduction layers.

A portion of the peripheral region PREG between the left-bottom corner region CLB and the left-upper corner region CLU may be referred to as an end node region ENR. A portion of the peripheral region PREG between the left-bottom corner region CLB and the left-upper corner region CLU may be referred to as a first edge region ERG1, a portion of the peripheral region PREG between the right-bottom corner region CRB and the right-upper corner region CRU may be referred to as a second edge region ERG2, and a portion of the peripheral region PREG between the left-upper corner region CLU and the right-upper corner region CRU may be referred to as a third edge region ERG3.

In this disclosure, "upper", "bottom", "left" and "right" are used not to represent particular fixed positions but to represent relative positions. Accordingly, example embodiments may include structures of bilateral symmetry, structures of top and bottom symmetry, rotated structures and the like with respect to the defect detection structure CDST disclosed herein.

FIGS. 2A and 2B are diagrams illustrating conduction loops included in a defect detection structure according to example embodiments. FIG. 2A illustrates a first conduction loop LP1 and a second conduction loop LP2 and FIG. 2B illustrates a third conduction loop LP3 and a fourth conduction loop LP4.

Referring to FIG. 2A, the first conduction loop LP1 passes through the left-bottom corner region CLB and the second conduction loop LP2 passes through the right-bottom corner region CRB.

The first conduction loop LP1 extends along the peripheral region PREG from an input end node ENI located in an end node region ENR between the left-bottom corner region CLB and the right-bottom corner region CRB to the first edge region ERG1 between the left-bottom corner region CLB and the left-upper corner region CLU by passing through or in the left-bottom corner region CLB and returns from the first edge region ERG1 to a first output end node ENO1 located in the end node region ENR.

The second conduction loop LP extends along the peripheral region PREG from the input end node ENI to the second edge region ERG2 between the right-bottom corner region CRB and the right-upper corner region CRU by passing through or in the right-bottom corner region CRB and returns from the second edge region ERG2 to a second output end node ENO2 located in the end node region ENR.

Referring to FIG. 2B, the third conduction loop LP3 passes through the left-bottom corner region CLB and the left-upper corner region CLU and the fourth conduction loop LP4 passes through the right-bottom corner region CRB and the right-upper corner region CRU.

The third conduction loop LP3 extends along the peripheral region PREG from the input end node ENI to the third edge region ERG3 between the left-upper corner region CLU and the right-upper corner region CRU by passing through or in the left-bottom corner region CLB and the left-upper corner region CLU and returns from the third edge region ERG3 to a third output end node ENO3 located in the end node region ENR.

The fourth conduction loop LP4 extends along the peripheral region PREG from the input end node ENI to the third edge region ERG3 by passing through or in the right-bottom corner region CRB and the right-upper corner region CRU and returns from the third edge region ERG3 to a fourth output end node ENO4 located in the end node region ENR.

As a result, some or all of the end nodes of the first through fourth conduction loops LP1~LP4, that is, some or all of the input end node ENI and the first through fourth output end nodes ENO1~ENO4 may be located in the end node region ENR. In addition, the first through fourth conduction loops LP1~LP4 may be electrically connected by the common input end node ENI.

Figure 3:
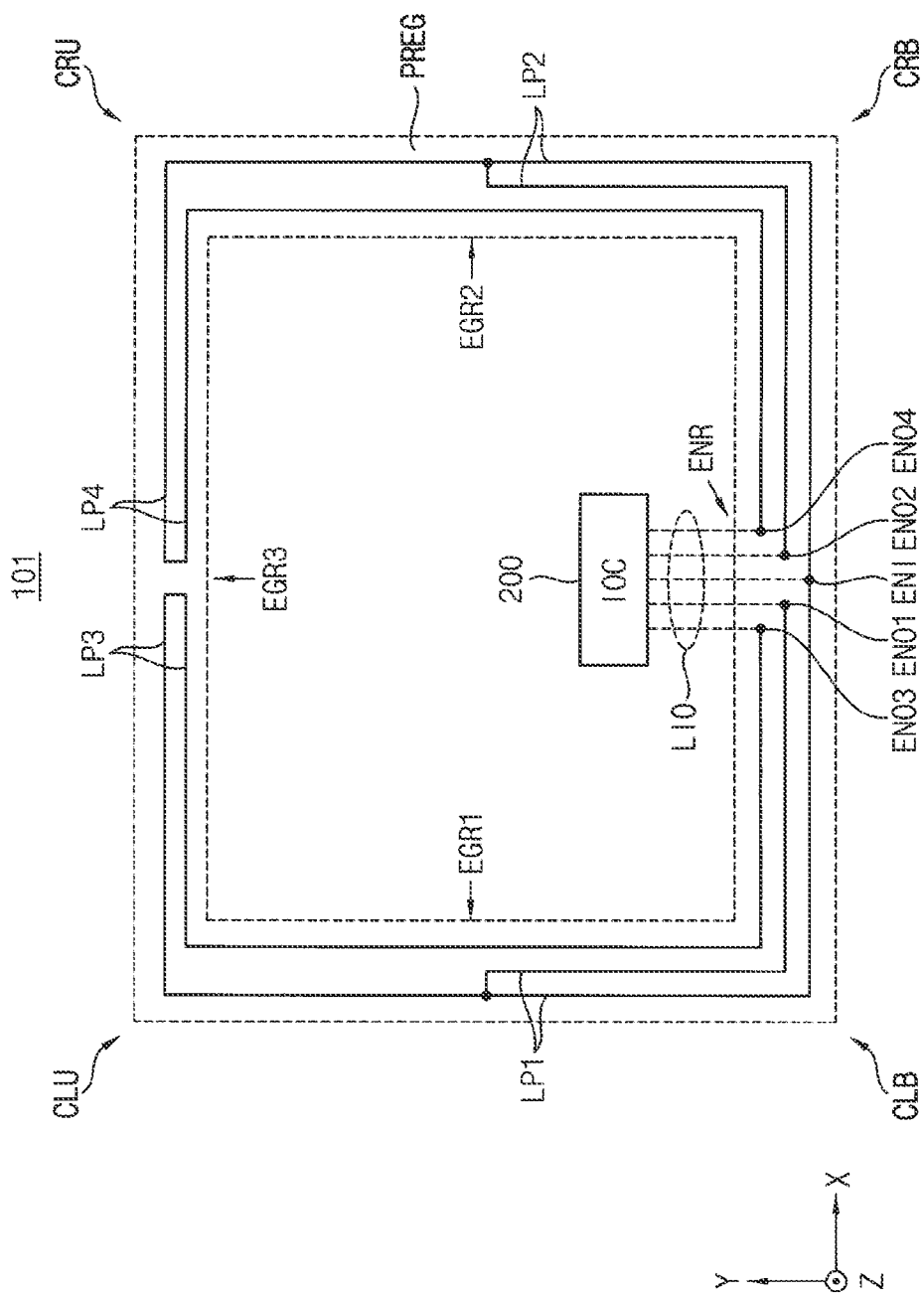
FIG. 3 is a diagram illustrating a semiconductor device according to example embodiments.

FIG. 3 is a diagram illustrating a semiconductor device according to example embodiments.

Referring to FIG. 3, a semiconductor device 101 may include a defect detection structure CDST having a ring shape formed in the peripheral region PREG of the semiconductor die and an input-output circuit IOC 200.

The defect detection structure CDST may include a first conduction loop LP1, a second conduction loop LP2, a third conduction loop LP3 and/or a fourth conduction loop LP4. The first conduction loop LP1 passes through the left-bottom corner region CLB, the second conduction loop LP2 passes through the right-bottom corner region CRB, the third conduction loop LP3 passes through the left-bottom corner region CLB and the left-upper corner region CLU, and the fourth conduction loop LP4 passes through the right-bottom corner region CRB and the right-upper corner region CRU.

The end nodes ENI and ENO1~ENO4 of the first through fourth conduction loops LP1~LP4 may be connected to the input-output circuit 200 via input-output lead lines LIO. The input-output lead lines LIO may be formed in various locations depending on the locations of the input-output circuit 200 and the end nodes ENI and ENO1~ENO4. Example embodiments of the input-output circuit 200 will be described below with reference to FIGS. 19 and 21.

As illustrated in FIG. 3, a horizontal line of the first conduction loop LP1 extending from the input end node ENI to the first edge region ERG1 may overlap with a portion of a horizontal line of the third conduction loop LP3 extending from the input end node ENI to the third edge region ERG3, and a horizontal line of the second conduction loop LP2 extending from the input end node ENI to the second edge region ERG2 may overlap with a portion of a horizontal line of the fourth conduction loop LP4 extending from the input end node ENI to the third edge region ERG3.

Hereinafter, example embodiments of the defect detection structure CDST included in the semiconductor device 101 of FIG. 3 will be described below with reference to FIGS. 4 through 10B.

Figure 4:
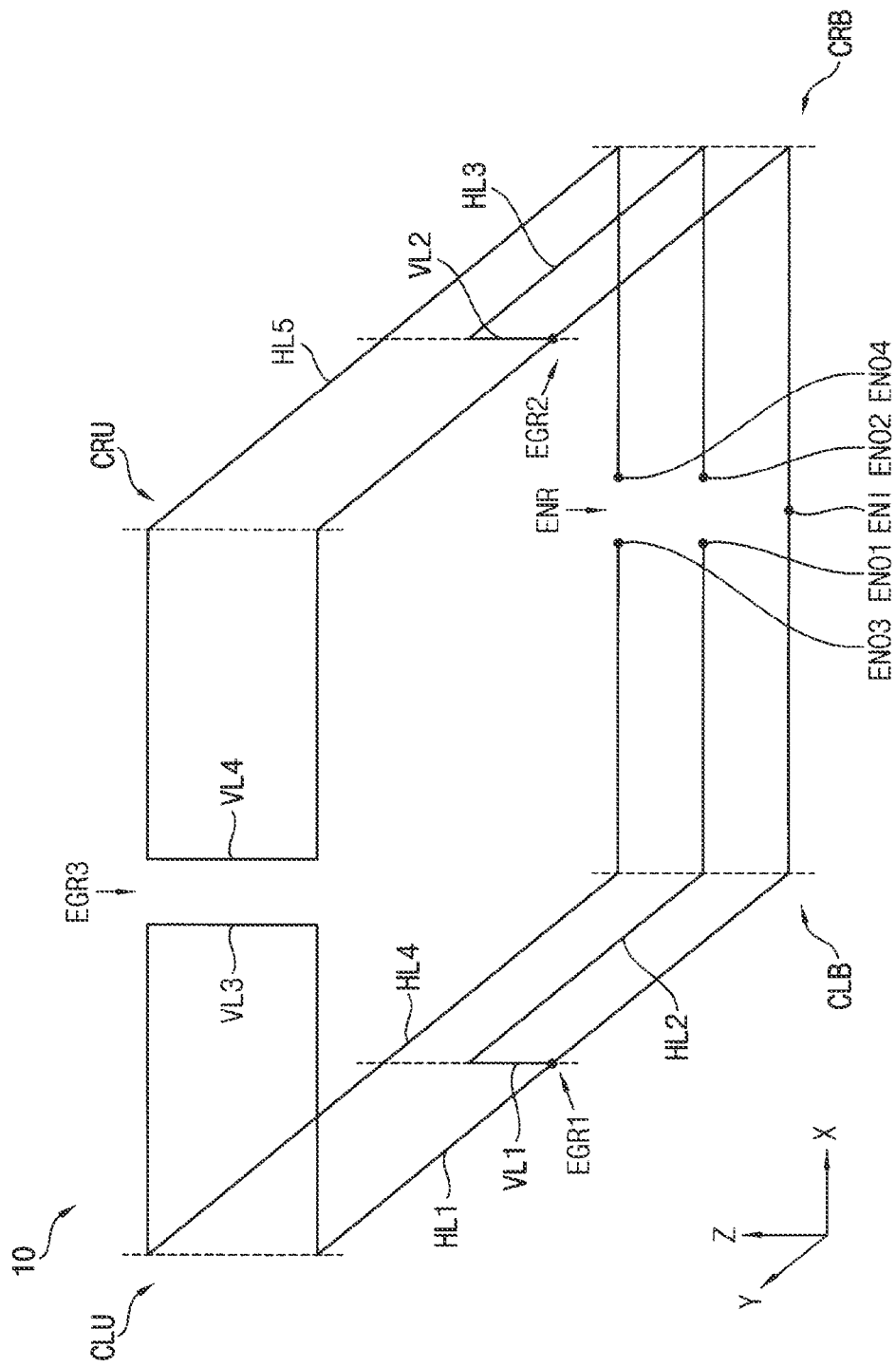
FIG. 4 is a perspective view illustrating a defect detection structure according to example embodiments.
Figure 5A:
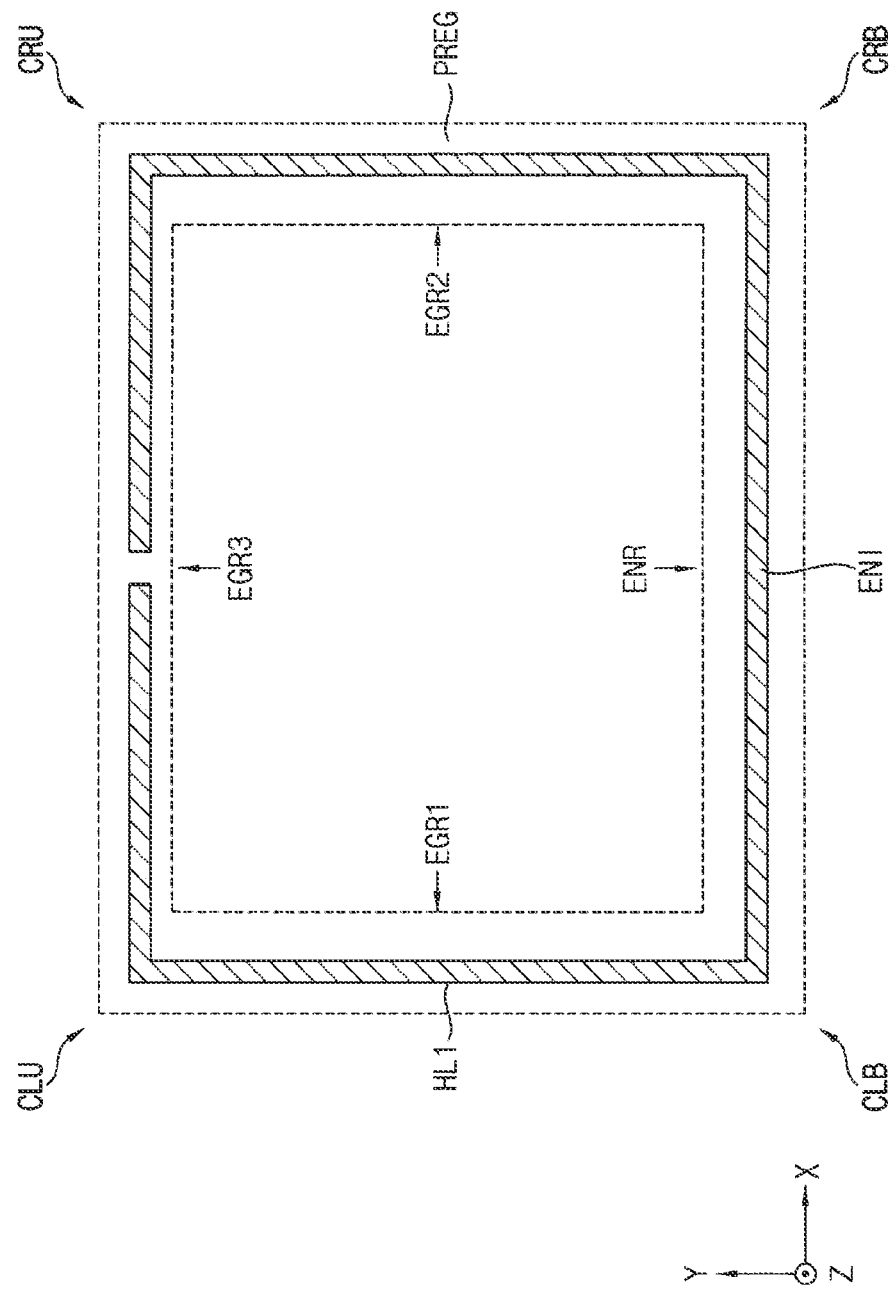
Figure 5B:
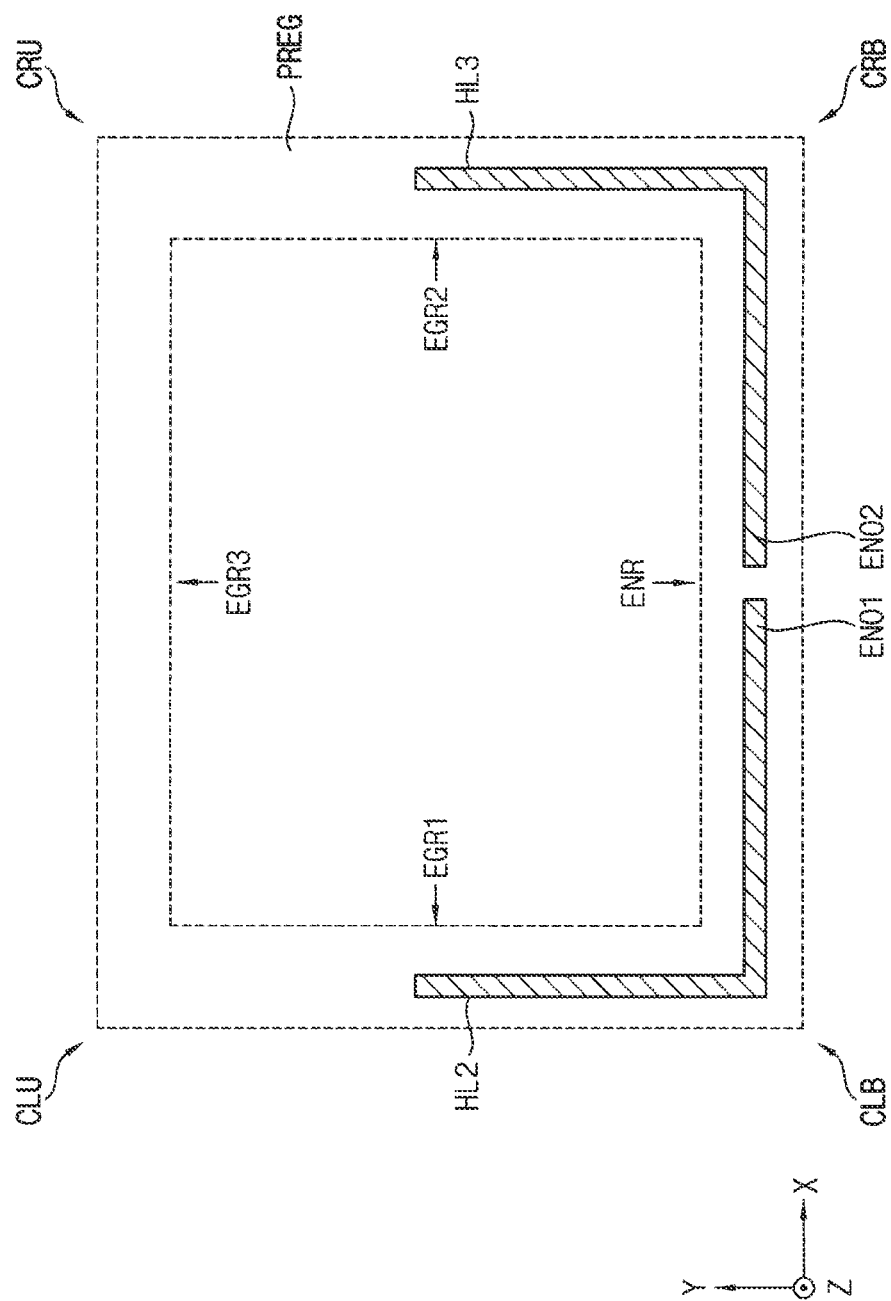
Figure 6B:
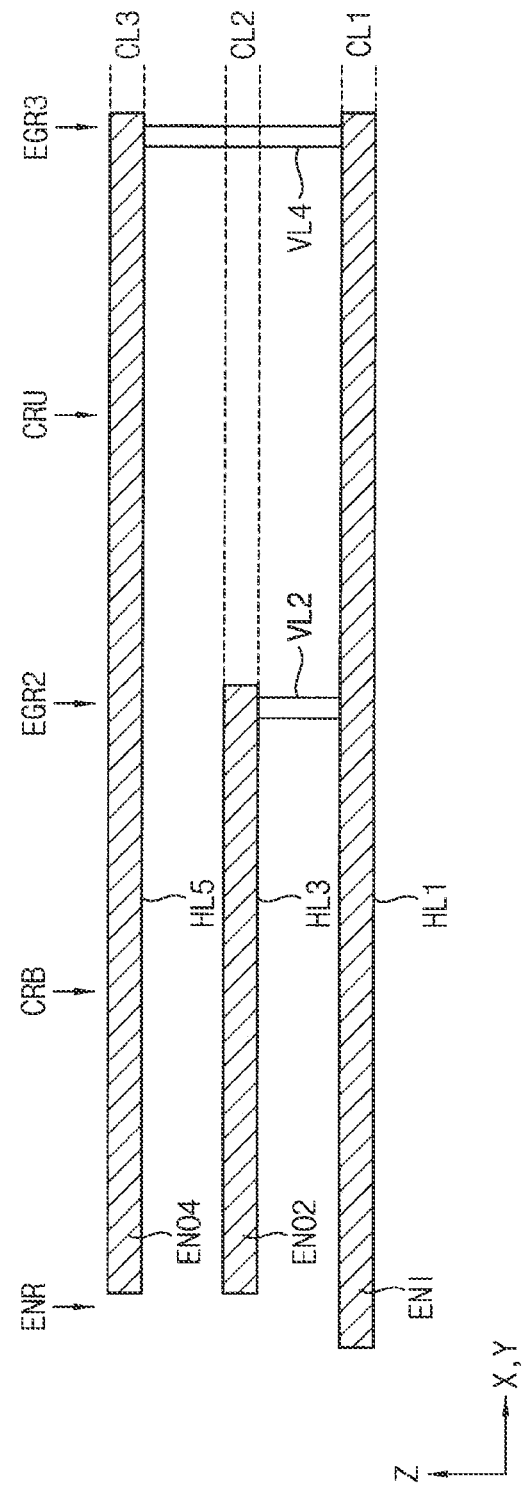

FIG. 4 is a perspective view illustrating a defect detection structure according to example embodiments, FIGS. 5A, 5B and 5C are top views illustrating layouts of conduction layers of the defect detection structure of FIG. 4, and FIGS. 6A and 6B are cross-sectional views illustrating a vertical structure of the defect detection structure of FIG. 4. The repeated descriptions with FIGS. 1 through 3 are omitted.

FIG. 5A illustrates a layout of a first conduction layer CL1, FIG. 5B illustrates a layout of a second conduction layer CL2 and FIG. 5C illustrates a layout of a third conduction layer CL3. FIG. 6A illustrates a cross-sectional view along the line A-A' in FIG. 1 and FIG. 6B illustrates a cross-sectional view along the line B-B' in FIG. 1.

Referring to FIGS. 4 through 6B, a defect detection structure 10 may include a first horizontal line HL1, a second horizontal line HL2, a third horizontal line HL3, a fourth horizontal line HL4, a fifth horizontal line HL5, a first vertical line VL1, a second vertical line VL2, a third vertical line VL3 and/or a fourth vertical line VL4.

The first horizontal line HL1 is formed in the first conduction layer CL1. The first horizontal line HL1 of a ring shape extends along the peripheral region PREG by passing through the left-bottom corner region CLB, the left-upper corner region CLU, the right-upper corner region CRU and the right-bottom corner region CRB. The first horizontal line HL1 is cut in the third edge region ERG3 between the left-upper corner region CLU and the right-upper corner region CRU.

The second horizontal line HL2 is formed in the second conduction layer CL2. The second horizontal line HL2 extends from a first output end node ENO1 located in the end node region ENR between the left-bottom corner region CLB and the right-bottom corner region CRB to the first edge region ERG1 between the left-bottom corner region CLB and the left-upper corner region CLU by passing through the left-bottom corner region CLB.

The third horizontal line HL3 is formed in the second conduction layer CL2. The third horizontal line HL3 extends from a second output end node ENO2 located in the end node region ENR to the second edge region ERG2 between the right-bottom corner region CRB and the right-upper corner region CRU by passing through the right-bottom corner region CRB.

The fourth horizontal line HL4 is formed in the third conduction layer CL3. The fourth horizontal line HL4 extends from a third output end node ENO3 located in the end node region ENR to the third edge region ERG3 by passing through the left-bottom corner region CLB and the left-upper corner region CLU.

The fifth horizontal line HL5 is formed in the third conduction layer CL3. The fifth horizontal line HL5 extends from a fourth output end node ENO4 located in the end node region ENR to the third edge region ERG3 by passing through the right-bottom corner region CRB and the right-upper corner region CRU.

The first vertical line VL1 connects the first horizontal line HL1 and the second horizontal line HL2 in the first edge region ERG1, and the second vertical line VL2 connects the first horizontal line HL1 and the third horizontal line HL3 in the second edge region ERG2. The third vertical line VL3 connects the first horizontal line HL1 and the fourth horizontal line HL4 in the third edge region ERG3, and the fourth vertical line VL4 connects the first horizontal line HL1 and the fifth horizontal line HL5 in the third edge region ERG3.

The first conduction loop LP1 in FIG. 3 includes a portion of the first horizontal line HL1, the first vertical line VL1 and the second horizontal line HL2. The second conduction loop LP2 in FIG. 3 includes a portion of the first horizontal line HL1, the second vertical line VL2 and the third horizontal line HL3. The third conduction loop LP3 in FIG. 3 includes a portion of the first horizontal line HL1, the third vertical line VL3 and the fourth horizontal line HL4. The fourth conduction loop LP4 in FIG. 3 includes a portion of the first horizontal line HL1, the fourth vertical line VL4 and the fifth horizontal line HL5.

As such, the first conduction loop LP1 and the second conduction loop LP2 may be formed using the first conduction layer CL1 and the second conduction layer CL2 and the third conduction loop LP3 and the fourth conduction loop LP4 may be formed using the first conduction layer CL1 and the third conduction layer CL3.

FIGS. 7A and 7B are cross-sectional views illustrating a semiconductor device including the defect detection structure of FIG. 4 according to example embodiments. FIGS. 7A and 7B illustrate cross-sectional views along the line A-A' in FIG. 1. Even though not illustrated, the cross-sectional views along the line B-B' in FIG. 1 have bilateral symmetry with respect to those of FIGS. 7A and 7B, respectively. The repeated descriptions with FIGS. 1 through 6B are omitted.

Referring to FIG. 7A, a defect detection structure may be formed using conduction layers above a semiconductor substrate SUB. The above-described first conduction layer CL1 may correspond to a polysilicon layer PL, the above-described second conduction layer CL2 may correspond to a first metal layer ML1 above the polysilicon layer PL and the above-described third conduction layer CL3 may correspond to a second metal layer ML2 above the first metal layer ML1. FIG. 7A illustrates the one polysilicon layer PL and the two metal layers ML1 and ML2 for convenience of illustrations, but the semiconductor device may include two or more polysilicon layers and three or more metal layers.

The vertical lines VL1 and VL3 may include vertical contacts to connect the horizontal lines HL1, HL2 and HL4 formed in the polysilicon layer PL, the first metal layer ML1 and the second metal layer ML2. In some example embodiments, intermediate conduction layers may exist between the polysilicon layer PL and the second metal layer ML2. In this case, each of the vertical lines VL1 and VL3 may include a plurality of vertical contacts.

Referring to FIG. 7B, a defect detection structure may be formed using conduction layers above a semiconductor substrate SUB and a metal layer beneath a bottom surface of the semiconductor substrate SUB. The above-described first conduction layer CL1 may correspond to a bottom metal layer MB beneath the semiconductor substrate SUB, the above-described second conduction layer CL2 may correspond to a first metal layer ML1 above a polysilicon layer PL and the above-described third conduction layer CL3 may correspond to a second metal layer ML2 above the first metal layer ML1.

The vertical lines VL1 and VL3 may include vertical contacts and/or through-silicon vias TSV1 and TSV2 penetrating the semiconductor substrate SUB to connect the horizontal lines HL1, HL2 and HL4 formed in the bottom metal layer MB, the first metal layer ML1 and the second metal layer ML2.

The two example embodiments of the defect detection structure using the conduction layers above and below the semiconductor substrate SUB are described with reference to FIGS. 7A and 7B. It would be easily understood that the defect detection structure according to example embodiments may be implemented using various combinations of conduction layers.

Figure 8:
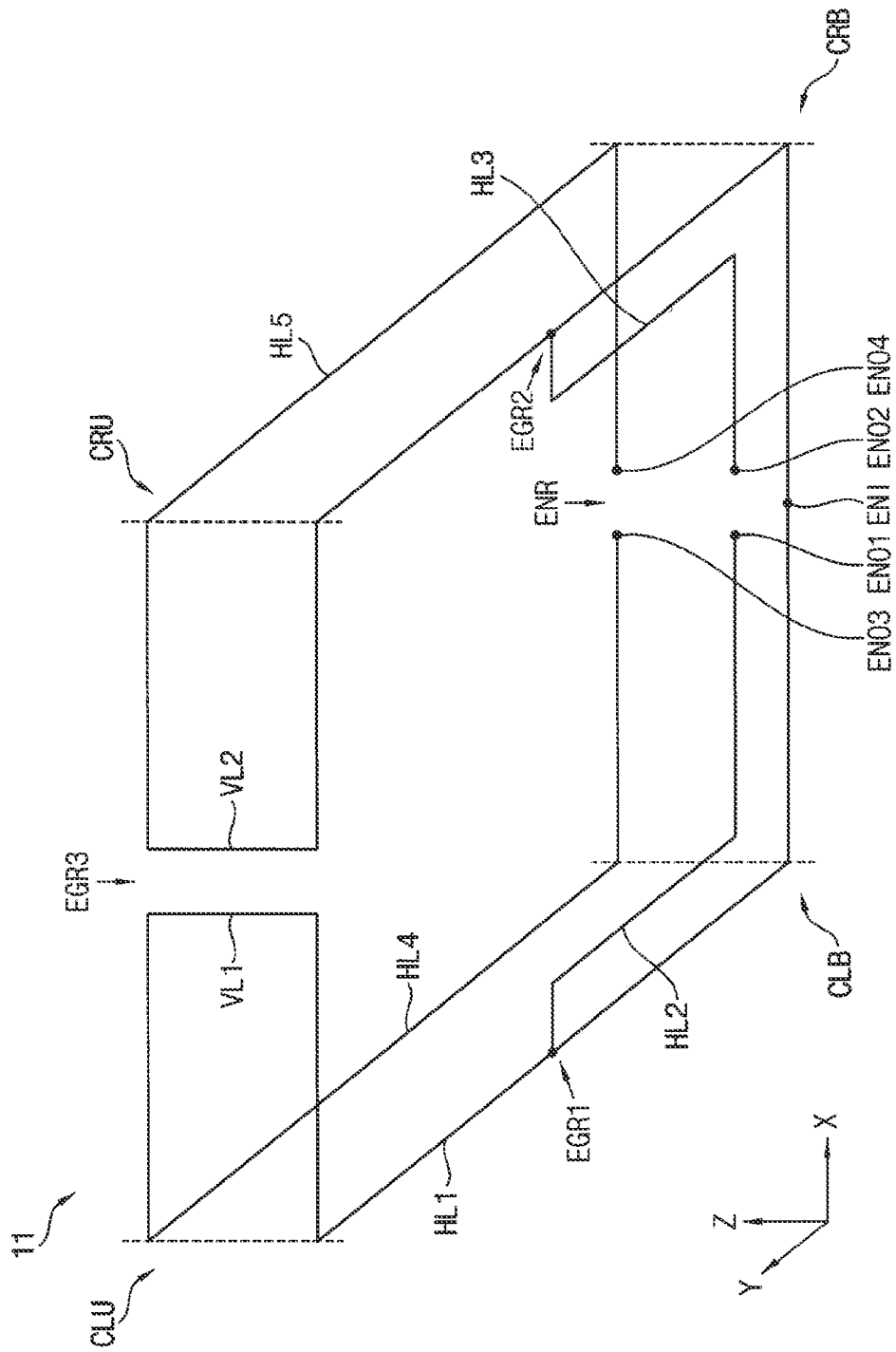
FIG. 8 is a perspective view illustrating a defect detection structure according to example embodiments.
Figure 9B:
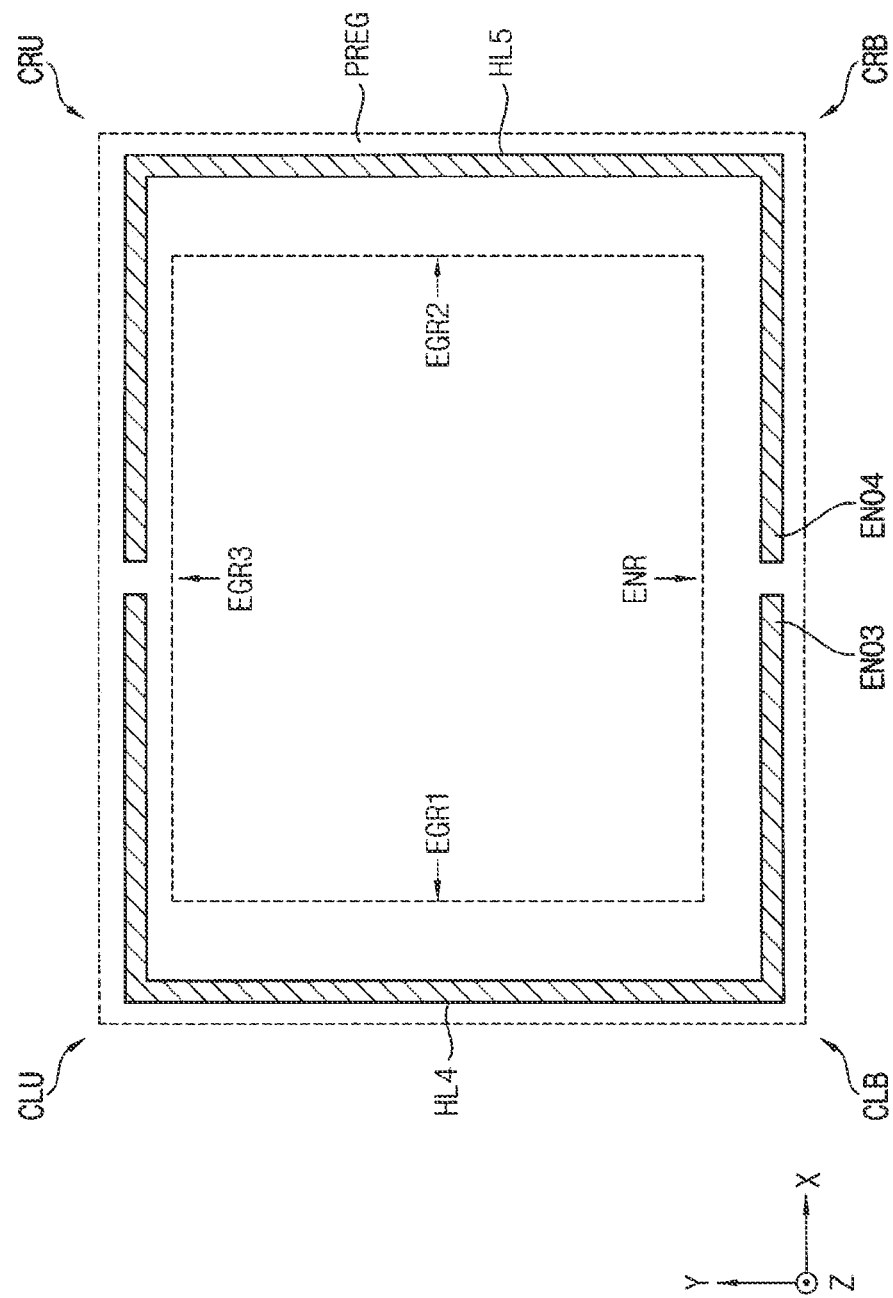
Figure 10A:
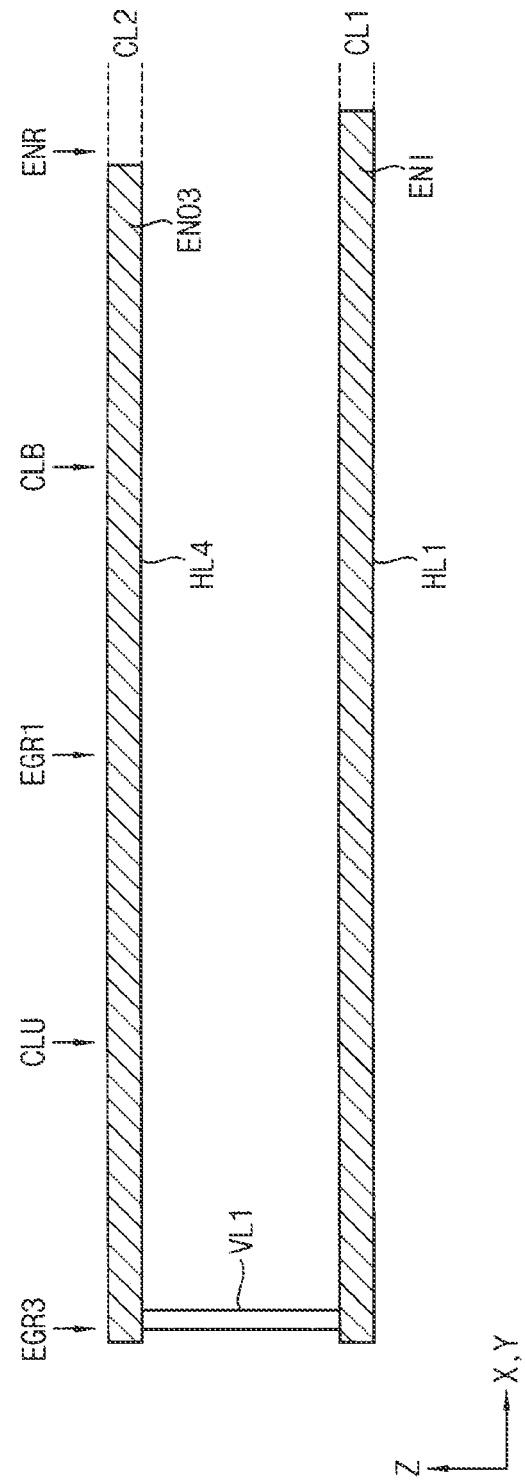
FIGS. 10A and 10B are cross-sectional views illustrating a vertical structure of the defect detection structure of FIG. 8, according to example embodiments.
Figure 10B:
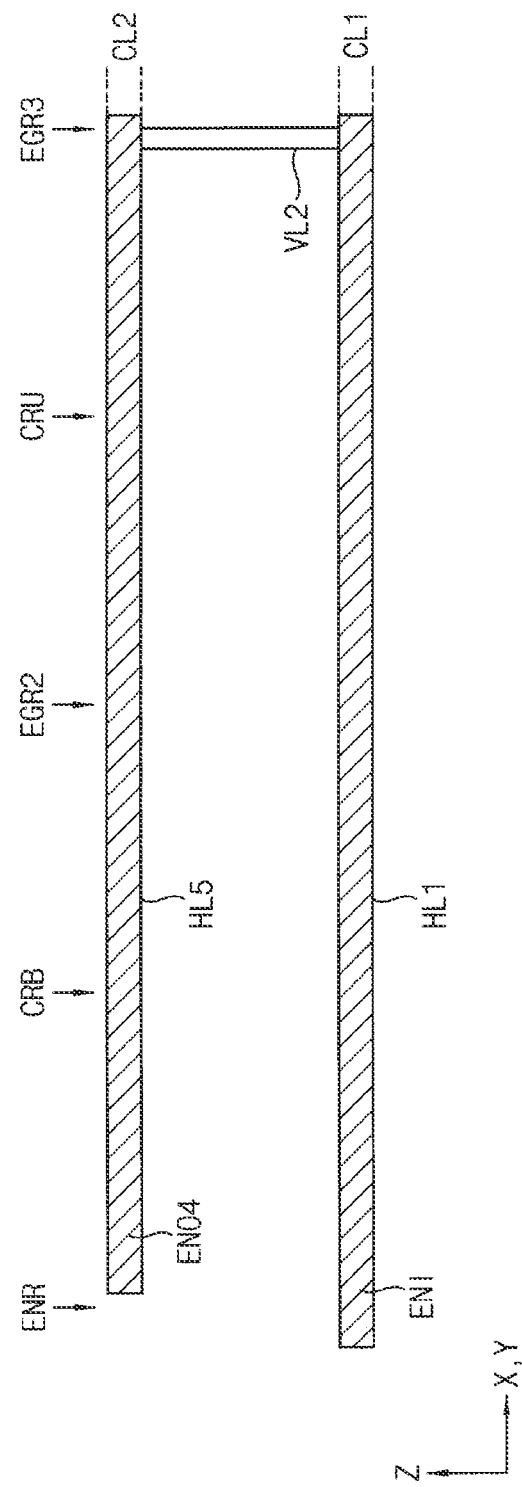

FIG. 8 is a perspective view illustrating a defect detection structure according to example embodiments, FIGS. 9A and 9B are top views illustrating layouts of conduction layers of the defect detection structure of FIG. 8 and FIGS. 10A and 10B are cross-sectional views illustrating a vertical structure of the defect detection structure of FIG. 8. The repeated descriptions with FIGS. 1 through 3 are omitted.

FIG. 9A illustrates a layout of a first conduction layer CL1 and FIG. 9B illustrates a layout of a second conduction layer CL2. FIG. 10A illustrates a cross-sectional view along the line A-A' in FIG. 1 and FIG. 10B illustrates a cross-sectional view along the line B-B' in FIG. 1.

FIG. 9A illustrates a layout of a first conduction layer CL1 and FIG. 9B illustrates a layout of a second conduction layer CL2. FIG. 10A illustrates a cross-sectional view along the line A-A' in FIG. 1 and FIG. 10B illustrates a cross-sectional view along the line B-B' in FIG. 1.

Referring to FIGS. 8 through 10B, a defect detection structure 11 may include a first horizontal line HL1, a second horizontal line HL2, a third horizontal line HL3, a fourth horizontal line HL4, a fifth horizontal line HL5, a first vertical line VL1 and/or a second vertical line VL2.

The first horizontal line HL1 is formed in the first conduction layer CL1. The first horizontal line HL1 of a ring shape extends along the peripheral region PREG by passing through the left-bottom corner region CLB, the left-upper corner region CLU, the right-upper corner region CRU and the right-bottom corner region CRB. The first horizontal line HL1 is cut in the third edge region ERG3 between the left-upper corner region CLU and the right-upper corner region CRU.

The second horizontal line HL2 is formed in first conduction layer CL1. The second horizontal line HL2 extends from a first output end node ENO1 located in the end node region ENR between the left-bottom corner region CLB and the right-bottom corner region CRB to the first edge region ERG1 between the left-bottom corner region CLB and the left-upper corner region CBL by passing through the left-bottom corner region CLB to be connected to the first horizontal line HL1 in the first edge region ERG1.

The third horizontal line HL3 is formed in the first conduction layer CL1. The third horizontal line HL3 extends from a second output end node ENO2 located in the end node region ENI to the second edge region ERG2 between the right-bottom corner region CRB and the right-upper corner region ERU by passing through the right-bottom corner region CRB to be connected to the first horizontal line HL1 in the second edge region ERG2.

The fourth horizontal line HL4 is formed in the second conduction layer CL2. The fourth horizontal line HL4 extends from a third output end node ENO3 located in the end node region ENR to the third edge region ERG3 by passing through the left-bottom corner region CLB and the left-upper corner region CLU.

The fifth horizontal line HL5 is formed in the second conduction layer CL2. The fifth horizontal line HL5 extends from a fourth output end node ENO4 located in the end node region ENR to the third edge region ERG3 by passing through the right-bottom corner region CRB and the right-upper corner region CRU.

The first vertical line VL1 connects the first horizontal line HL1 and the fourth horizontal line HL4 in the third edge region ERG3, and the second vertical line VL2 connects the first horizontal line HL1 and the fifth horizontal line HL5 in the third edge region ERG3.

The first conduction loop LP1 in FIG. 8 includes a portion of the first horizontal line HL1 and the second horizontal line HL2. The second conduction loop LP2 in FIG. 8 includes a portion of the first horizontal line HL1 and the third horizontal line HL3. The third conduction loop LP3 in FIG. 8 includes a portion of the first horizontal line HL1, the first vertical line VL1 and the fourth horizontal line HL4. The fourth conduction loop LP4 in FIG. 8 includes a portion of the first horizontal line HL1, the second vertical line VL2 and the fifth horizontal line HL5.

As such, the first conduction loop LP1 and the second conduction loop LP2 may be formed using the first conduction layer CL1. The third conduction loop LP3 and the fourth conduction loop LP4 may be formed using the first conduction layer CL1 and the second conduction layer CL2.

Comparing the defect detection structure 10 of FIG. 4 and the defect detection structure 11 of FIG. 8, the defect detection structure 10 of FIG. 4 may have a smaller occupation area when viewed from the top and the defect detection structure 11 of FIG. 8 may use a smaller number of conduction layers.

FIG. 11 is a diagram illustrating a semiconductor device according to example embodiments.

Referring to FIG. 11, a semiconductor device 102 may include a defect detection structure CDST having a ring shape formed in the peripheral region PREG of the semiconductor die and an input-output circuit IOC 200.

The defect detection structure CDST includes a first conduction loop LP1, a second conduction loop LP2, a third conduction loop LP3 and a fourth conduction loop LP4. The first conduction loop LP1 passes through the left-bottom corner region CLB, the second conduction loop LP2 passes through the right-bottom corner region CRB, the third conduction loop LP3 passes through the left-bottom corner region CLB and the left-upper corner region CLU, and the fourth conduction loop LP4 passes through the right-bottom corner region CRB and the right-upper corner region CRU.

The end nodes ENI and ENO1~ENO4 of the first through fourth conduction loops LP1~LP4 may be connected to the input-output circuit 200 via input-output lead lines LIO. The input-output lead lines LIO may be formed in various locations depending on the locations of the input-output circuit 200 and the end nodes ENI and ENO1~ENO4. Example embodiments of the input-output circuit 200 will be described below with reference to FIGS. 19 and 21.

Compared with the structure of FIG. 3 in which portions of some horizontal lines overlaps with other horizontal lines, the first through fourth conduction loops LP1~LP4 of FIG. 11 may be implemented with distinct horizontal lines, respectively.

Hereinafter, example embodiments of the defect detection structure CDST included in the semiconductor device 102 of FIG. 11 will be described below with reference to FIGS. 12, 13 and 14.

Figure 12:
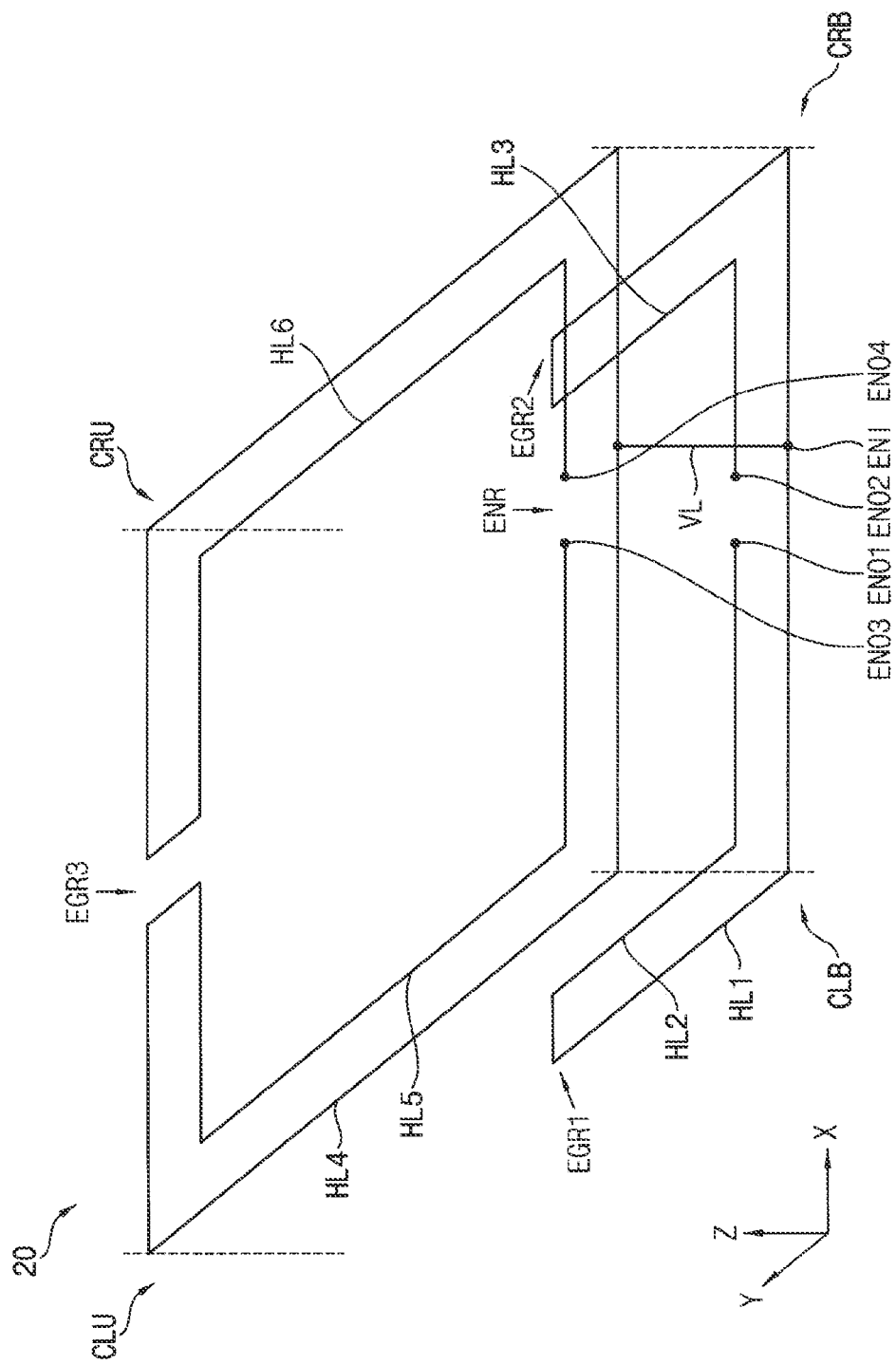
FIG. 12 is a perspective view illustrating a defect detection structure according to example embodiments.
Figure 13:
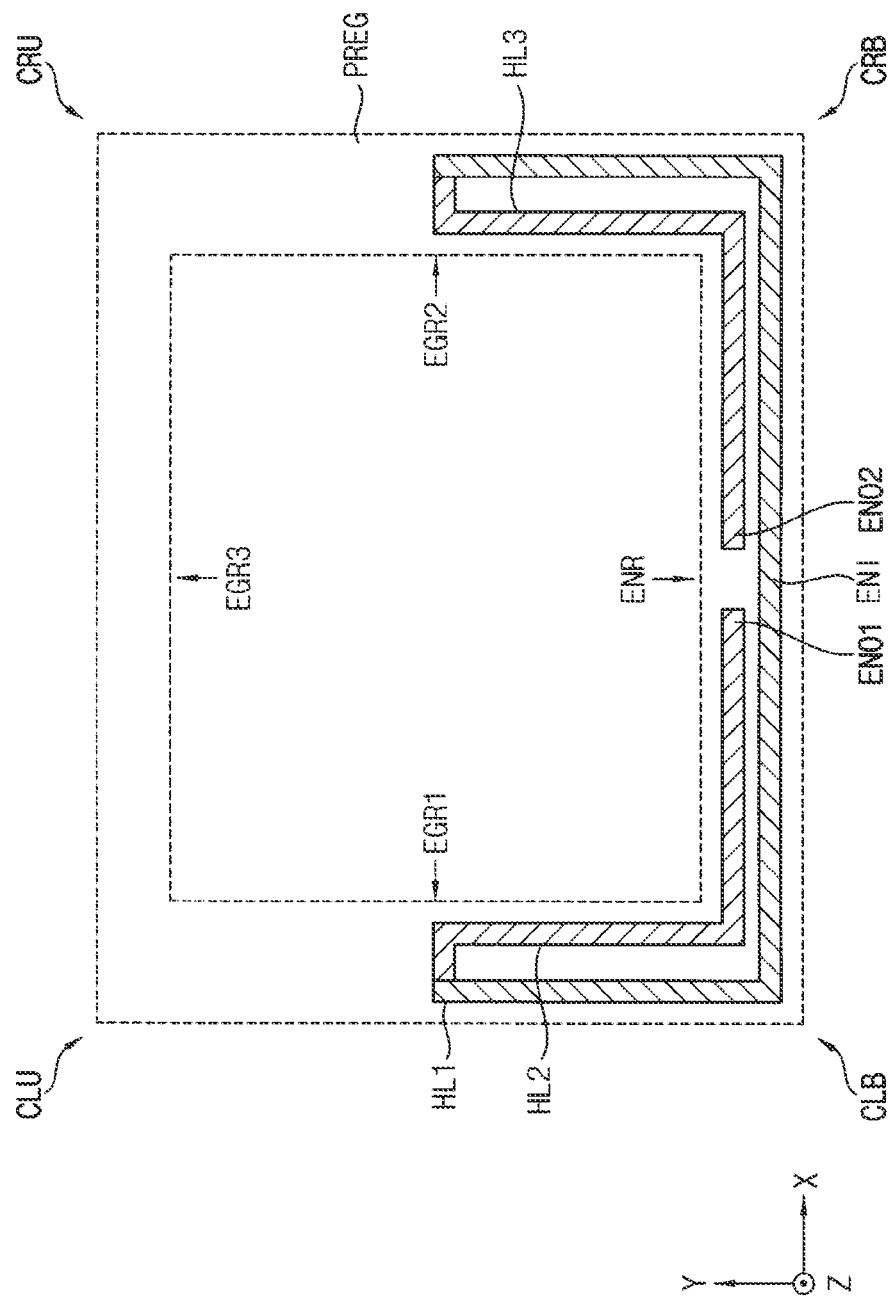
FIGS. 13 and 14 are top views illustrating layouts of conduction layers of the defect detection structure of FIG. 12, according to example embodiments.
Figure 14:
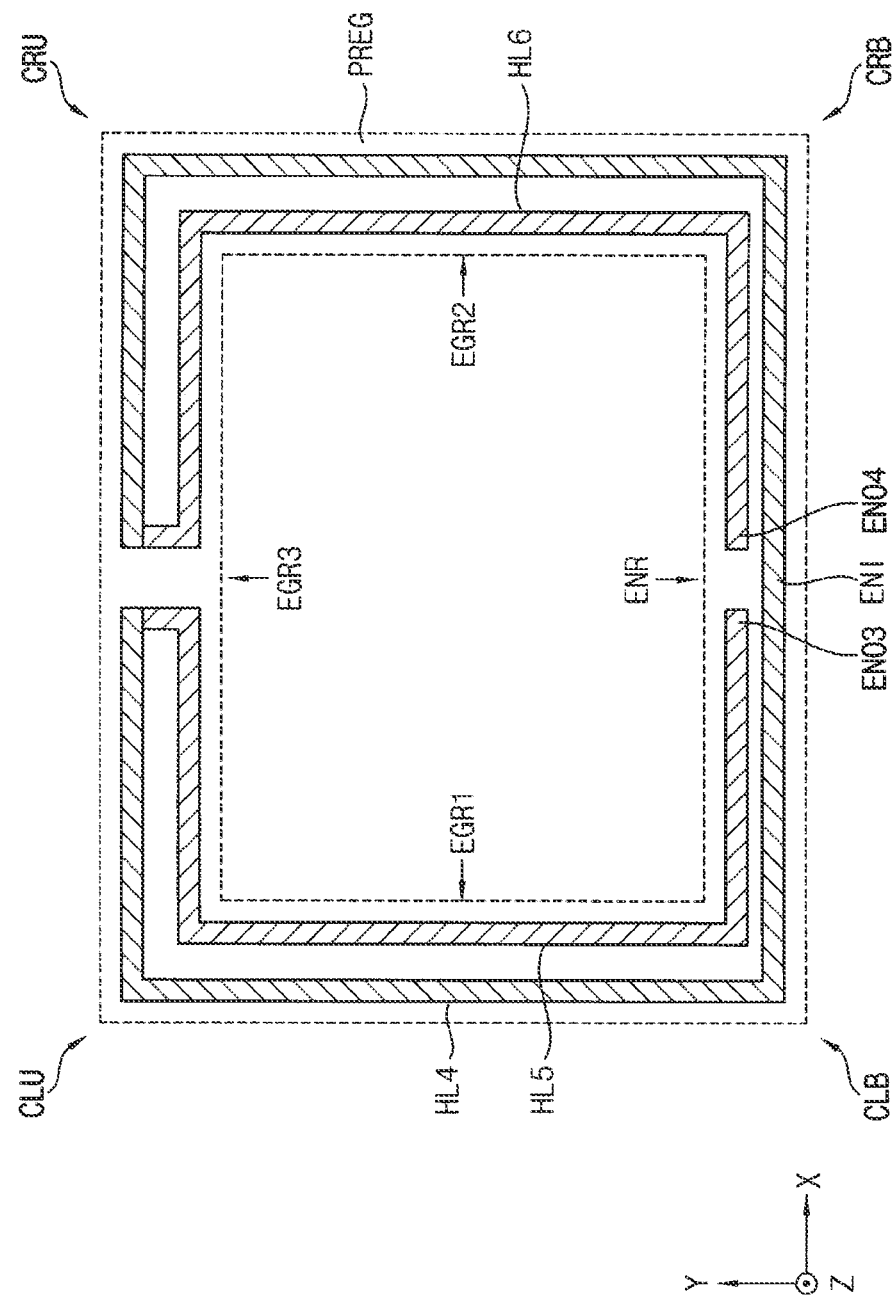

FIG. 12 is a perspective view illustrating a defect detection structure according to example embodiments, and FIGS. 13 and 14 are top views illustrating layouts of conduction layers of the defect detection structure of FIG. 12. The repeated descriptions with FIGS. 1 through 3 are omitted. FIG. 13 illustrates a layout of a first conduction layer CL1. FIG. 14 illustrates a layout of a second conduction layer CL2.

Referring to FIGS. 12, 13 and 14, a defect detection structure 20 may include a first horizontal line HL1, a second horizontal line HL2, a third horizontal line HL3, a fourth horizontal line HL4, a fifth horizontal line HL5, a sixth horizontal line HL6 and/or a vertical line VL.

The first horizontal line HL1 is formed in the first conduction layer CL1. The first horizontal line HL1 extends from the first edge region ERG1 between the left-bottom corner region CLB and the left-upper corner region CLU to the second edge region ERG2 between the right-bottom corner region CRB and the right-upper corner region CRU by passing through the left-bottom corner region CLB and the right-bottom corner region CRB.

The second horizontal line HL2 is formed in first conduction layer CL1. The second horizontal line HL2 extends from a first output end node ENO1 located in the end node region ENR between the left-bottom corner region CLB and the right-bottom corner region CRB to the first edge region ERG1 by passing through the left-bottom corner region CLB to be connected to the first horizontal line HL1 in the first edge region ERG1.

The third horizontal line HL3 is formed in the first conduction layer CL1. The third horizontal line HL3 extends from a second output end node ENO2 located in the end node region ENR to the second edge region ERG2 by passing through the right-bottom corner region CRB to be connected to the first horizontal line HL1 in the second edge region ERG2.

The fourth horizontal line HL4 is formed in the second conduction layer CL2. The fourth horizontal line HL4 of a ring shape extends along the peripheral region PREG by passing through the left-bottom corner region CLB, the left-upper corner region CLU, the right-upper corner region CRU and the right-bottom corner region CRB. The fourth horizontal line HL4 is cut in the third edge region ERG3 between the left-upper corner region CLU and the right-upper corner region CRU.

The fifth horizontal line HL5 is formed in the second conduction layer CL2. The fifth horizontal line HL5 extends from a third output end node ENO3 located in the end node region ENR to the third edge region ERG3 by passing through the left-bottom corner region CLB and the left-upper corner region CLU to be connected to the fourth horizontal line HL4 in the third edge region ERG3.

The sixth horizontal line HL6 is formed in the second conduction layer CL2. The sixth horizontal line HL6 extends from a fourth output end node ENO4 located in the end node region ENR to the third edge region ERG3 by passing through the right-bottom corner region CRB and the right-upper corner region CRU to be connected to the fourth horizontal line HL4 in the third edge region ERG3.

The vertical line VL connects the first horizontal line HL1 and the fourth horizontal line HL4 in the end node region ENR.

The first conduction loop LP1 in FIG. 11 includes a portion of the first horizontal line HL1 and the second horizontal line HL2. The second conduction loop LP2 in FIG. 11 includes a portion of the first horizontal line HL1 and the third horizontal line HL3. The third conduction loop LP3 in FIG. 11 includes a portion of the fourth horizontal line HL4 and the fifth horizontal line HL5. The fourth conduction loop LP4 in FIG. 11 includes a portion of the fourth horizontal line HL4 and the sixth horizontal line HL6.

As such, the first conduction loop LP1 and the second conduction loop LP2 may be formed using the first conduction layer CL1 and the third conduction loop LP3 and the fourth conduction loop LP4 may be formed using the second conduction layer CL2.

Figure 15:
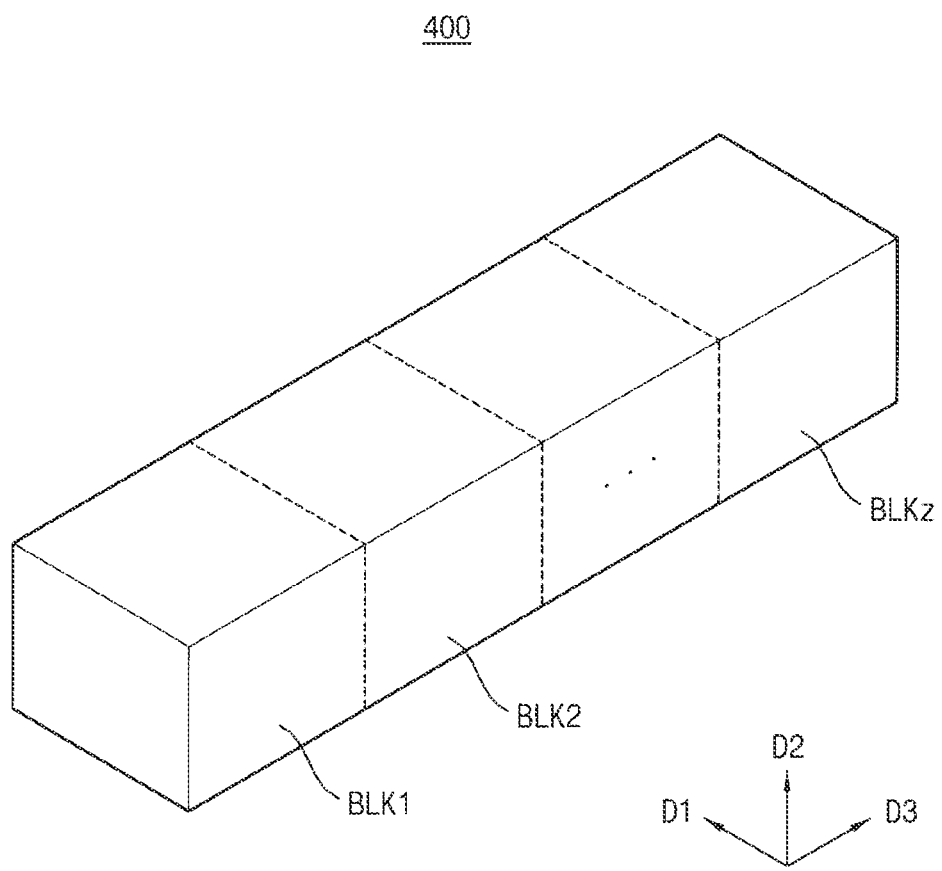
FIG. 15 is a block diagram illustrating a memory cell array included in a NAND flash memory device that may be integrated in a semiconductor device, according to example embodiments.
Figure 16:
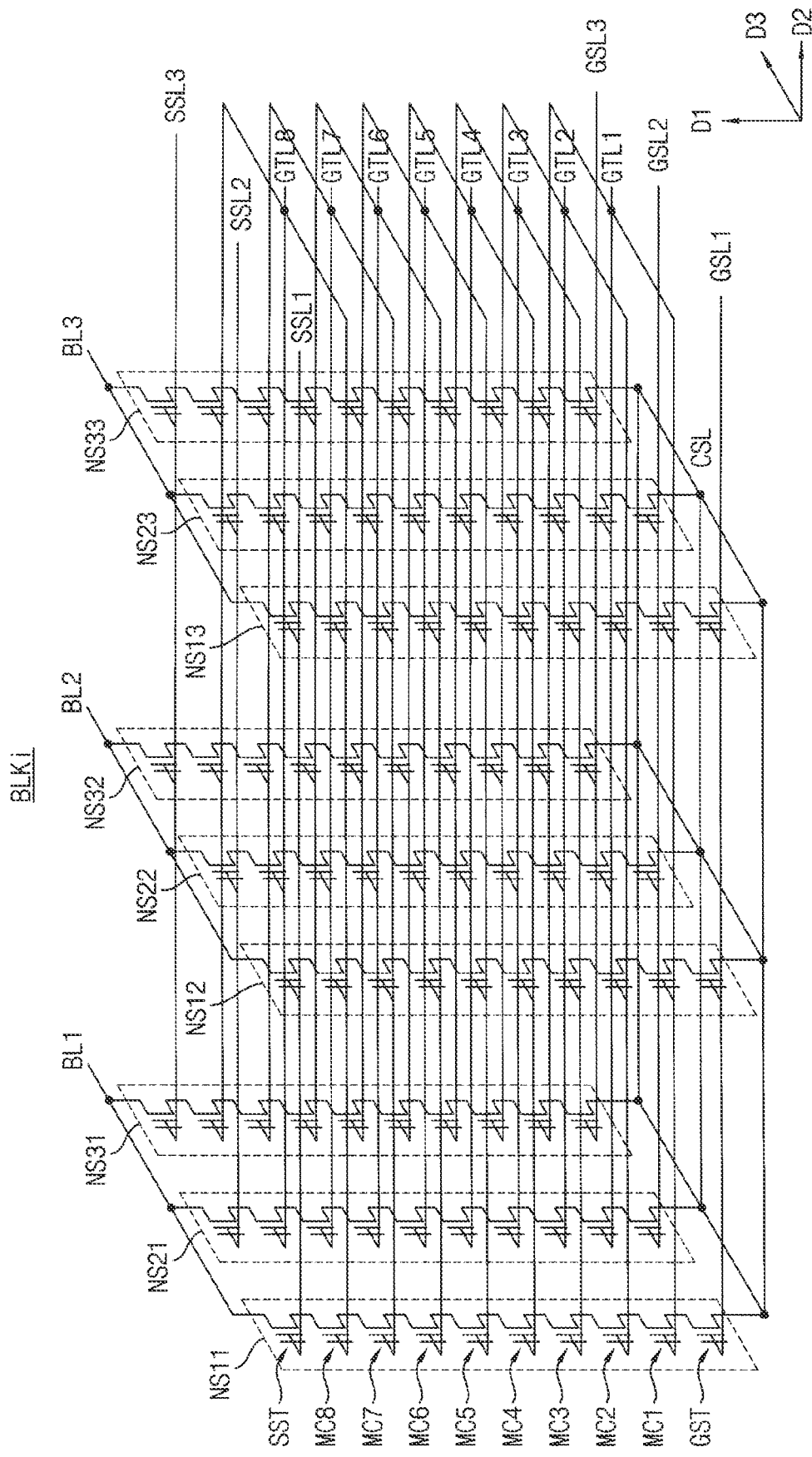
FIG. 16 is a circuit diagram illustrating an equivalent circuit of the memory block in the memory cell array of FIG. 15, according to example embodiments.

FIG. 15 is a block diagram illustrating a memory cell array included in a NAND flash memory device that may be integrated in a semiconductor device. FIG. 16 is a circuit diagram illustrating an equivalent circuit of the memory block in the memory cell array of FIG. 15.

Referring to FIG. 15, a memory cell array 400 of a NAND flash memory device may include a plurality of memory blocks BLK1 to BLKz. In an example embodiment, the memory blocks BLK1 to BLKz may be selected by an address decoder in the NAND flash memory device. For example, the address decoder may select a particular memory block corresponding to a block address among the memory blocks BLK1 to BLKz.

In FIGS. 15 and 16, a first direction D1 indicates a vertical direction perpendicular to an upper surface of a semiconductor substrate, a second direction D2 and a third direction D3 indicate two orthogonal directions parallel to the upper surface of the semiconductor substrate. The memory block BLKi of FIG. 12 may be formed on the semiconductor substrate in a three-dimensional structure (or a vertical structure). For example, a plurality of NAND strings or cell strings included in the memory block BLKi may extend in the first direction D1.

Referring to FIG. 16, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 16, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. In FIG. 16, the memory block BLKi is illustrated to be coupled to eight gate lines GTL1 to GTL8 and three bit lines BL1 to BL3. However, example embodiments are not limited thereto. Each memory block in the memory cell array 400 may be coupled to any number of word lines and any number of bit lines.

FIGS. 15 and 16 illustrate a non-limiting example embodiment that the semiconductor device, according to example embodiments, corresponds to the vertical NAND flash memory device, and the defect detection structure CDST may be applied to any semiconductor device that is manufactured using semiconductor dies.

Figure 17:
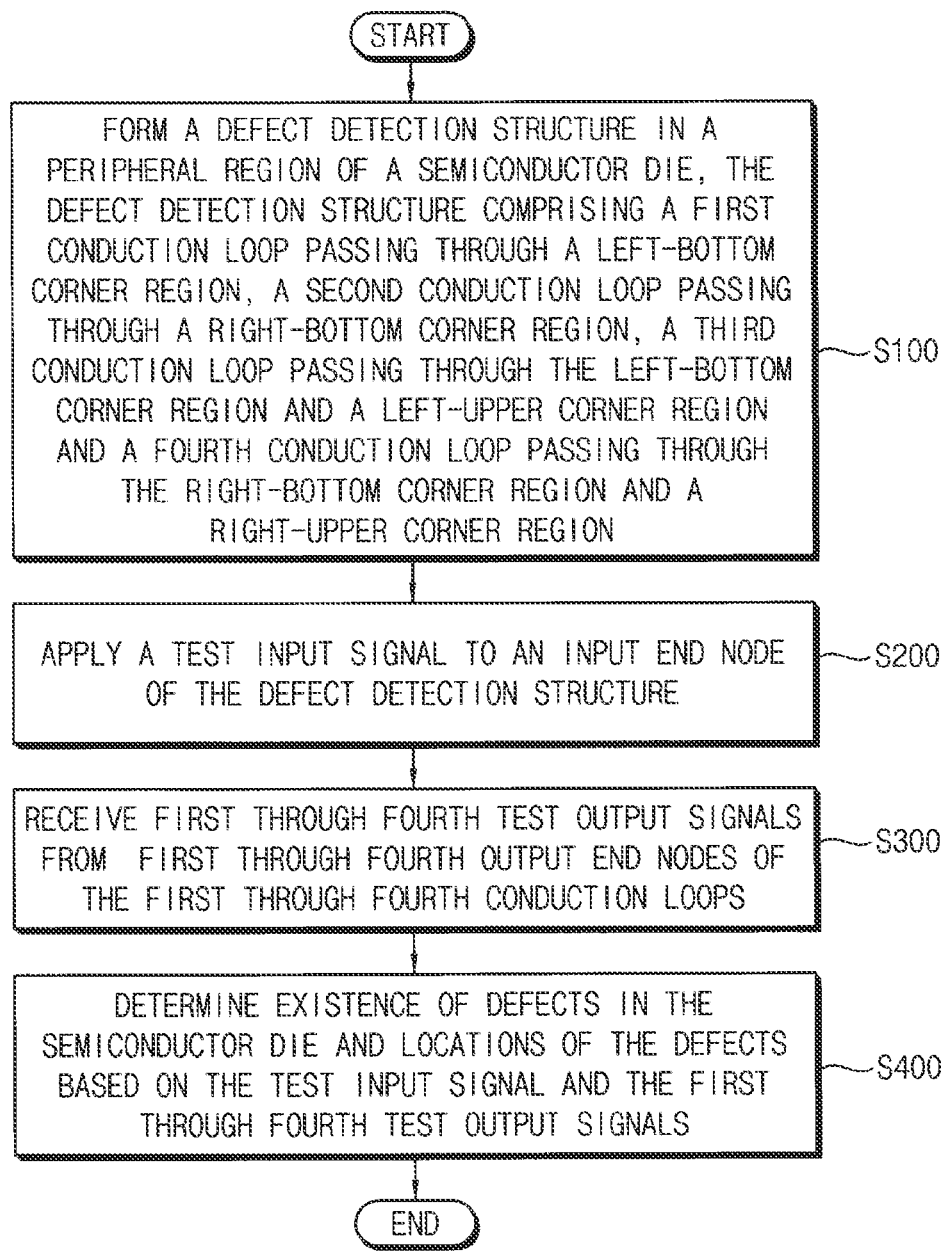
FIG. 17 is a flow chart illustrating a method of detecting defects in a semiconductor die according to example embodiments.

FIG. 17 is a flow chart illustrating a method of detecting defects in a semiconductor die according to example embodiments.

As described above, a semiconductor die SD may include a central region CREG in which a semiconductor integrated circuit is formed and a peripheral region PREG surrounding the central region CREG.

Referring to FIG. 17, a defect detection structure is formed in the peripheral region of a semiconductor die such that the defect detection structure includes a first conduction loop passing through a left-bottom corner region of the peripheral region PREG, a second conduction loop passing through a right-bottom corner region of the peripheral region PREG, a third conduction loop passing through the left-bottom corner region and a left-upper corner region of the peripheral region PREG and a fourth conduction loop passing through the right-bottom corner region and a right-upper corner region of the peripheral region PREG (S100).

A test input signal may be applied to an input end node of the defect detection structure (S200).

First through fourth test output signals are received from first and fourth output end nodes of the first through fourth conduction loops (S300).

Existence of defects in the semiconductor die and locations of the defects are determined based on the test input signal and the first through fourth test output signals (S400).

Figure 18:
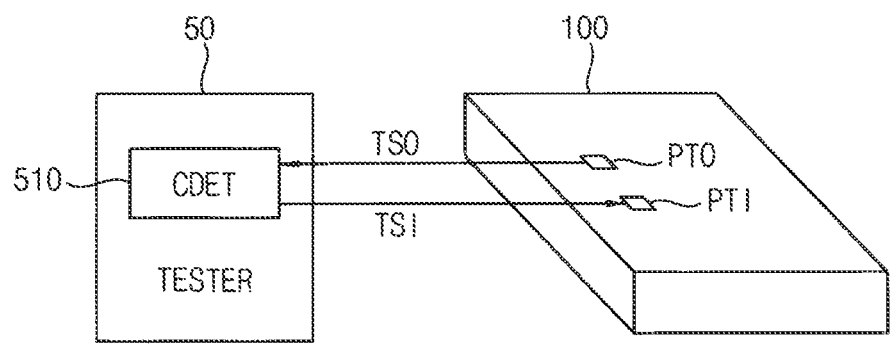
FIG. 18 is a block diagram illustrating a test system according to example embodiments.

FIG. 18 is a block diagram illustrating a test system according to example embodiments.

Referring to FIG. 18, a test system may include a tester 50 and a semiconductor device 100.

The semiconductor device 100 may include a defect detection structure CDST including first through fourth conduction loops LP1~LP4 as described above. The first conduction loop LP1 may be an open loop passing through or in the left-bottom corner region CLB and the second conduction loop LP2 may be an open loop passing through the right-bottom corner region CRB. The third conduction loop LP3 may be an open loop passing through or in the left-bottom corner region CLB and the left-upper corner region CLU, and/or the fourth conduction loop LP4 may be an open loop passing through or in the right-bottom corner region CRB and the right-upper corner region CRU.

The input end node ENI and the first through fourth output end nodes ENO1~ENO4 of the first through fourth conduction loops LP1~LP4 may be connected to a test input pad PTI and a test output pad PTO that are formed on a surface of the semiconductor device 100. The first through fourth conduction loops LP1~LP4 may be electrically connected to the external tester 50 through the test input-output pads PTI and PTO.

The tester 50 may include a crack detector (CDET) 510. The crack detector 510 may apply the test input signal TSI to the test input pad PTI, and then receive the test output signal TSO through the test output pad PTO, where the test output signal TSO corresponds to the test input signal TSI after passing through the first through fourth conduction loops LP1~LP4. The crack detector 510 may determine existence or occurrence of the defects in the semiconductor die and locations of the defects by comparing the test input signal TSI and the test output signal TSO.

Figure 19:
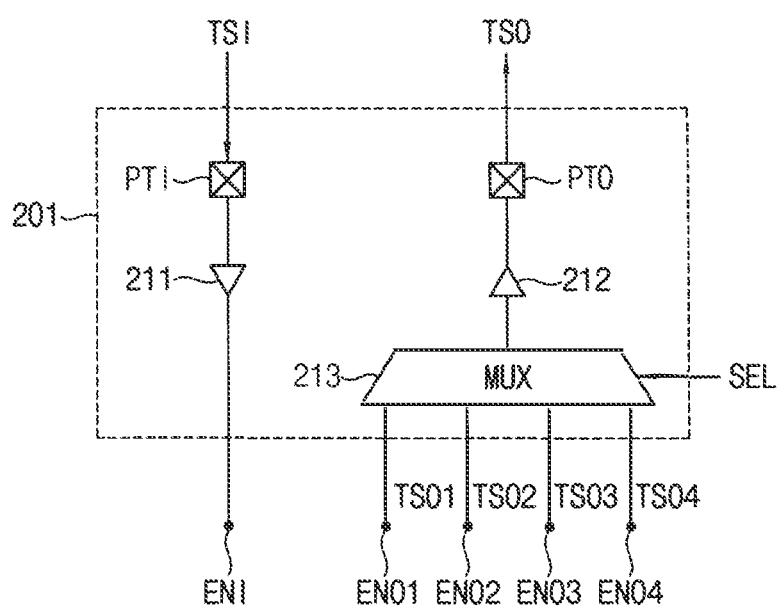
FIG. 19 is a circuit diagram illustrating an input-output circuit included in a semiconductor die according to example embodiments.
Figure 20:
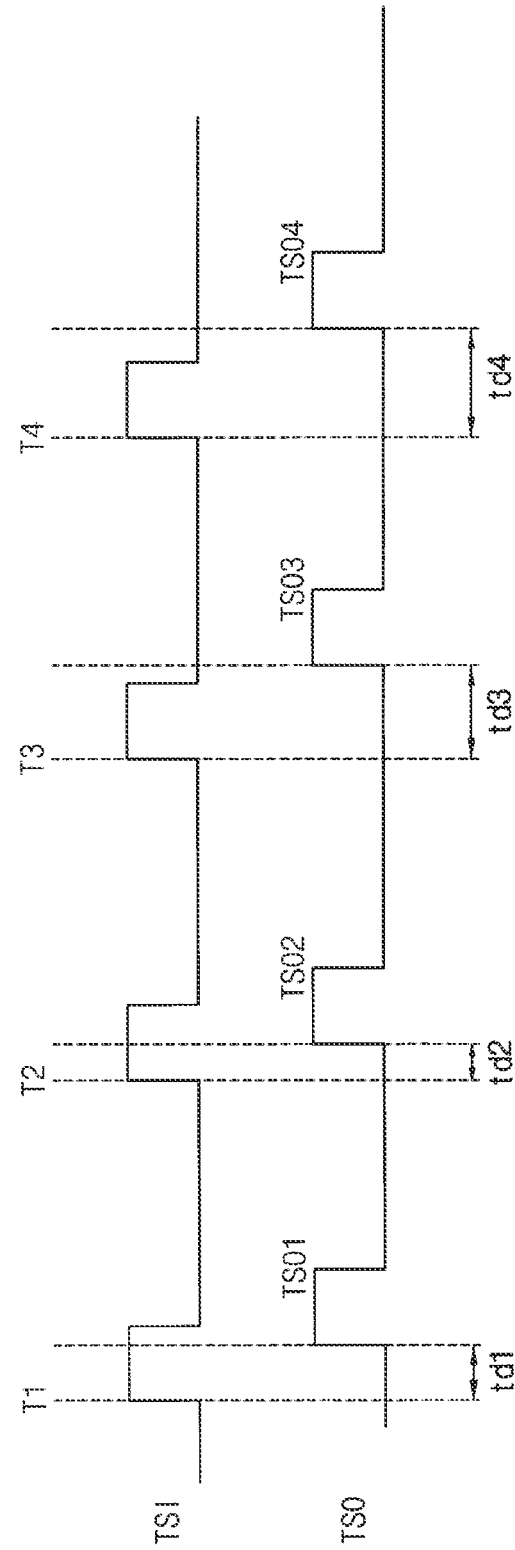
FIG. 20 is a timing diagram illustrating test signals of the input-output circuit of FIG. 19, according to example embodiments.

FIG. 19 is a circuit diagram illustrating an input-output circuit included in a semiconductor die according to example embodiments, and FIG. 20 is a timing diagram illustrating test signals of the input-output circuit of FIG. 19.

Referring to FIG. 19, an input-output circuit 201 may include an input buffer 211, an output buffer 212, a selection circuit 213, a test input pad PTI and a test output pad PTO. In some example embodiments, the input buffer 211 and/or the output buffer 212 may be omitted.

The test input pad PTI may be electrically connected to the input end node ENI to apply a test input signal TSI to the input end node ENI.

The selection circuit 213 may connect the test output pad PTO sequentially to a first output end node ENO1 of the first conduction loop LP1, a second output end node ENO2 of the second conduction loop LP2, a third output end node ENO3 of the third conduction loop LP3 and a fourth output end node ENO4 of the fourth conduction loop LP4. As a result, as illustrated in FIG. 20, a test output signal TSO from the selection circuit 213 may sequentially include first through fourth test output signals TSO1~TSO4 corresponding to the test input signal STI passing through the first through fourth conduction loops LP1~LP4, respectively.

Referring to FIG. 20, the crack detector 510 in FIG. 18 may compare a phase of the test input signal TSI with phases of the first through fourth test output signals TSO1~TSO4 to measure phase differences or delay times td1~td4. The existence of the defects and the locations of the defects may be determined based on the delay times td1~td4.

The crack detector 510 may generate the test input signal TSI that is activated in a form of pulses at time point T1~T4 to apply the test input signal TSI to the defect detection structure CDST and receive the first through fourth test output signals TSO1~TSO4 sequentially from the defect detection structure CDST. If any of the first through fourth test output signals TSO1~TSO4 does not include a pulse, it may be determined that the corresponding conduction loop is cut completely.

The first through fourth test output signals TSO1~TSO4 may have the first through fourth delay times td1~td4, respectively, with respect to the test input signal TSI. The defects such as cracks may be detected by comparing the first through fourth delay times td1~td4 with a reference value or by comparing mutually the first through fourth delay times td1~td4.

Figure 21:
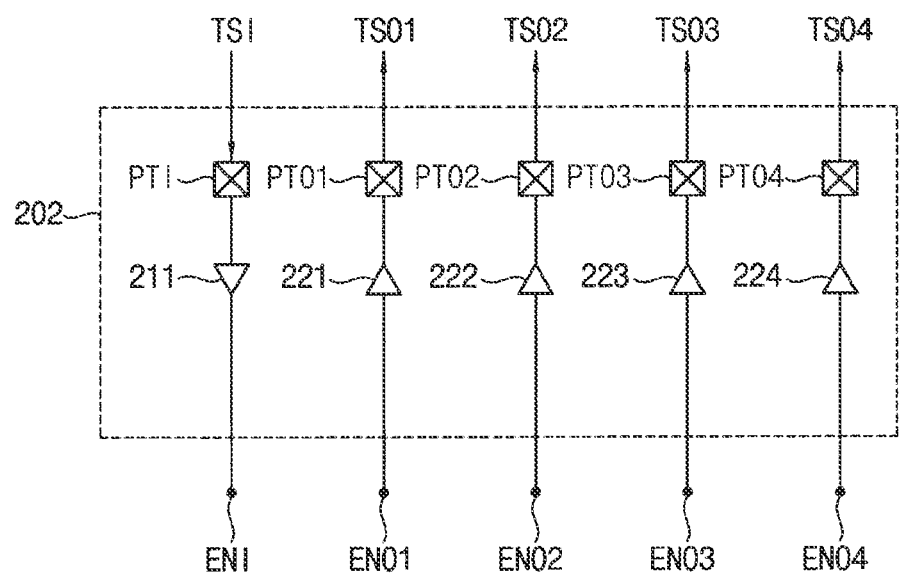
FIG. 21 is a circuit diagram illustrating an input-output circuit included in a semiconductor die according to example embodiments.
Figure 22:
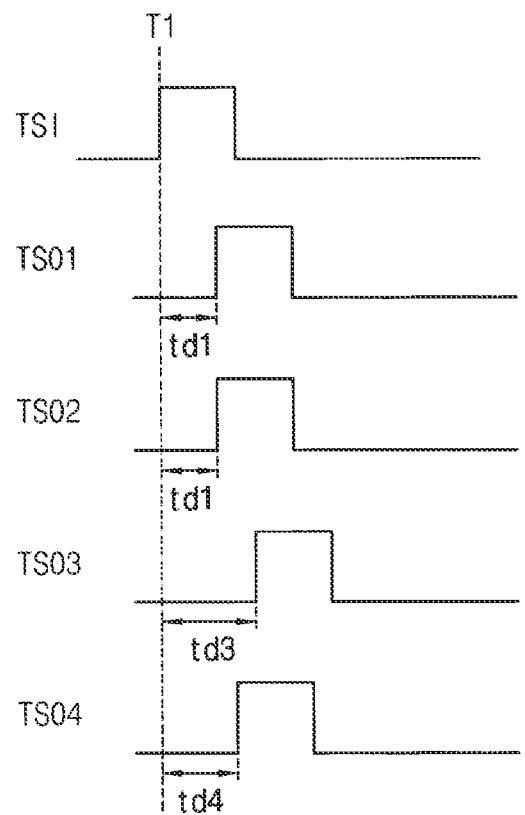
FIG. 22 is a timing diagram illustrating test signals of the input-output circuit of FIG. 21, according to example embodiments.

FIG. 21 is a circuit diagram illustrating an input-output circuit included in a semiconductor die according to example embodiments. FIG. 22 is a timing diagram illustrating test signals of the input-output circuit of FIG. 21.

Referring to FIG. 21, an input-output circuit 202 may include an input buffer 211, output buffers 221, 222, 223 and 224, a test input pad PTI and first through fourth test output pads PTO1~PTO4. In some example embodiments, the input buffer 211 and/or the output buffers 221, 222, 223 and 224 may be omitted.

The test input pad PTI may be electrically connected to the input end node ENI to apply a test input signal TSI to the input end node ENI.

The first through fourth test output pads PTO1~PTO4 may be electrically connected to first through fourth output end nodes ENO1~ENO4, respectively. As a result, as illustrated in FIG. 22, first through fourth test output signals TSO1~TSO4 corresponding to the test input signal STI passing through the first through fourth conduction loops LP1~LP4, respectively, may be provided in parallel.

Referring to FIG. 22, the crack detector 510 in FIG. 18 may compare a phase of the test input signal TSI with phases of the first through fourth test output signals TSO1~TSO4 to measure phase differences or delay times td1~td4. The existence of the defects and the locations of the defects may be determined based on the delay times td1~td4. FIG. 21 illustrates the case of the four test output pads PTO1~PTO4, but example embodiments are not limited thereto. In some example embodiments, using a selection circuit similar to that of FIG. 19, two of the first through fourth signals TSO1~TSO4 may be provided in parallel through two test output pads and then the other two of the first through fourth signals TSO1~TSO4 may be provided in parallel.

The crack detector 510 may generate the test input signal TSI that is activated in a form of a pulse at a time point T1 to apply the test input signal TSI to the defect detection structure CDST and receive the first through fourth test output signals TSO1~TSO4 in parallel from the defect detection structure CDST. If any of the first through fourth test output signals TSO1~TSO4 does not include a pulse, it may be determined that the corresponding conduction loop is cut completely.

The first through fourth test output signals TSO1~TSO4 may have the first through fourth delay times td1~td4, respectively, with respect to the test input signal TSI. The defects such as cracks may be detected by comparing the first through fourth delay times td1~td4 with a reference value or by comparing mutually the first through fourth delay times td1~td4.

Figures 23, 24:
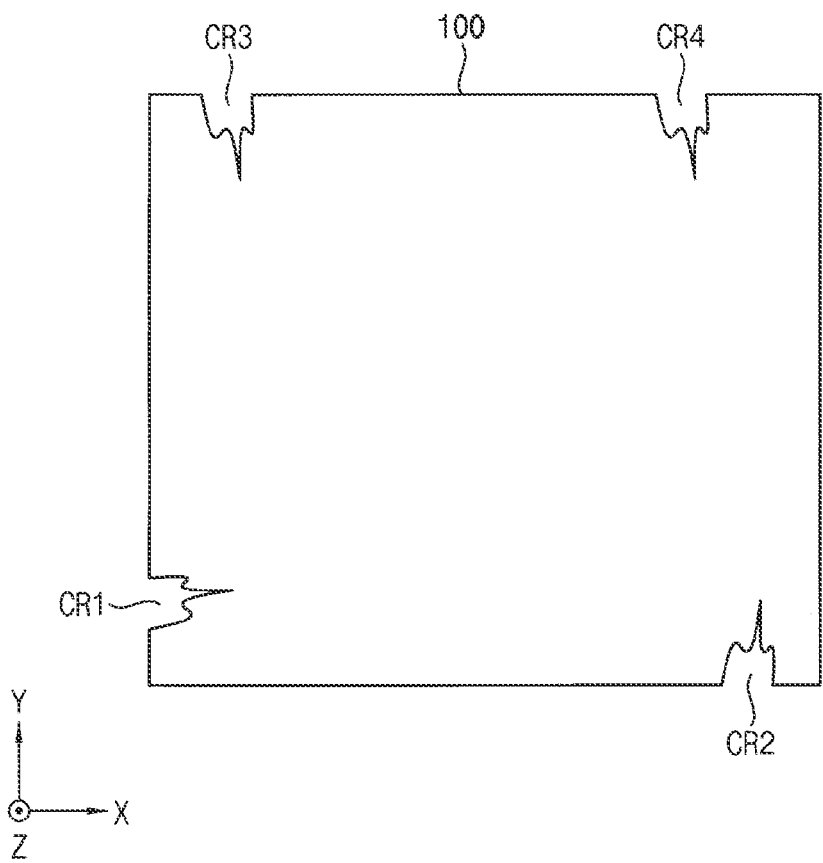
FIGS. 23 and 24 are diagrams for describing defect detection in a semiconductor device according to example embodiments.

FIGS. 23 and 24 are diagrams for describing defect detection in a semiconductor device according to example embodiments.

Referring to FIG. 23, cracks of various locations may be induced, for example, during a process of sawing a wafer. A first crack CR1 indicates defect near the left-bottom corner region CLB, a second crack CR2 indicates defect near the right-bottom corner region CRB, a third crack CR3 indicates defect near the left-upper corner region CLU, and a fourth crack CR4 indicates defect near the right-upper corner region CRU.

In the conventional schemes, occurrence of cracks is detected using a crack detect structure formed in a semiconductor device. In contrast, the defect detection structure CDST according to example embodiments may efficiently detect the locations of the defects such as the cracks in addition to the existence of the defects, using the plurality of conduction loops LP1~LP4 passing through different combinations of the corner regions.

FIG. 24 illustrates delays of the first through fourth conduction loops LP1~LP4 according to locations or positions of the cracks CR1~CR4. In FIG. 24, DEL indicates the delay time exceeds a reference value to indicate that the defect occurs in the corresponding conduction loop and NOR indicates the delay time is shorter that the reference value to indicate that the corresponding conduction loop does not include the defect.

As such, the measured result of the first through fourth conduction loops LP1~LP4 may have the different combinations depending on the locations of the cracks, and thus the locations of the cracks may be determined.

In the defect detection structure CDST as described with reference to FIGS. 1 through 14, the first conduction loop LP1 and the second conduction loop LP2 are symmetric bilaterally and the third conduction loop LP3 and the fourth conduction loop LP4 are symmetric bilaterally. In such symmetric structures, the first conduction loop LP1 and the second conduction loop LP2 may have substantially the same delay time and also the third conduction loop LP3 and the fourth conduction loop LP4 may have substantially the same delay time.

The locations of the defects may be determined regardless of the test input signal TSI by comparing the mutual delay of the first test output signal TSO1 and the second test output signal T502, and by comparing the mutual delay of the third test output signal T503 and the fourth test output signal T504.

FIG. 25 is a diagram for describing manufacturing processes of a stacked semiconductor device according to example embodiments.

Referring to FIG. 25, respective integrated circuits may be formed in a first wafer WF1 and a second wafer WF2. The same circuits may be integrated in the first wafer WF1 and the second wafer WF2 or different circuits may be integrated in the first wafer WF1 and the second wafer WF2. For example, pixel arrays may be formed in the first wafer WF1 and other circuits may be formed in the second wafer WF2. Even though FIG. 25 illustrates the vertical stacking of the two wafers WF1 and WF2 (e.g., wafer WF1 is stacked on wafer WF2), three or more wafers may be stacked vertically.

After the integrated circuits are formed in the first and second wafers WF1 and WF2, the first wafer WF1 and the second wafer WF2 are bonded. The bonded wafers WF1 and WF2 are cut and divided into a plurality of chips where each chip corresponds to a semiconductor device including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

According to example embodiments, each semiconductor device 100 may include a plurality of semiconductor dies SD1 and SD2 that are stacked in the vertical direction. The semiconductor dies SD1 and SD2 include the central regions and the peripheral regions surrounding the central regions, respectively. A plurality of semiconductor integrated circuits are formed in the central regions of the semiconductor dies, respectively. A defect detection structure CDST including the first through fourth conduction loops LP1~LP4 as described above is formed in a ring shape in the peripheral regions of the semiconductor dies SD1 and SD2 to surround the central regions.

Hereinafter, with reference to FIGS. 26A and 26B, example embodiments of a defect detection structure CDST formed across two semiconductor dies SD1 and SD2, but example embodiments are not limited thereto. In some example embodiments, a defect detection structure CDST, according to example embodiments, may be formed across three or more semiconductor dies.

FIGS. 26A and 26B are cross-sectional views illustrating a stacked semiconductor device including a defect detection structure according to example embodiments. The repeated descriptions with FIGS. 1 through 3 are omitted.

Referring to FIGS. 26A and 26B, a first semiconductor die SD1 may include a first semiconductor substrate SUB1 and a first dielectric layer DLY1 in which upper structures of the first semiconductor substrate SUB1 are formed, and a second semiconductor die SD2 may include a second semiconductor substrate SUB2 and a second dielectric layer DLY2 in which upper structures of the second semiconductor substrate SUB2 are formed. Each of the first and second dielectric layers DLY1 and DLY2 may include a plurality of conduction layers. For example, the first dielectric layer DLY1 may include a first polysilicon layer PL1, a first metal layer ML1 and/or a second metal layer ML2. The second dielectric layer DLY2 may include a second polysilicon layer PL2, a third metal layer ML3 and/or a fourth metal layer ML4. As illustrated in FIG. 26B, a bottom metal layer MB may be further formed on a bottom surface of the first semiconductor substrate SUB1. The polysilicon layers PL1 and PL2 may include a gate polysilicon layer in which gates of transistors in the semiconductor integrated circuits are formed. If the semiconductor integrated circuits include a semiconductor memory device, the polysilicon layers may further include a bit line polysilicon layer in which bit lines in the semiconductor integrated circuits are formed.

In the example embodiment of FIG. 26A, the above-described first conduction layer CL1 corresponds to the first polysilicon layer PL1 in the first semiconductor die SD1, the above-described second conduction layer CL2 corresponds to the second polysilicon layer PL2 in the second semiconductor die SD2, and the above-described third conduction layer CL3 corresponds to the fourth metal layer ML4 in the second semiconductor die SD2.

The above-described vertical lines connecting the horizontal lines HL1, HL2 and HL4 in the polysilicon layers PL1 and PL2 and the metal layer ML4 may include vertical contacts VL1, VL2, VL3 and VL4 and through-silicon vias TSV1 and TSV2 penetrating the second semiconductor die SD2.

In the example embodiment of FIG. 26B, the above-described first conduction layer CL1 corresponds to the bottom metal layer MB below the first semiconductor die SD1, the above-described second conduction layer CL2 corresponds to the second polysilicon layer PL2 in the second semiconductor die SD2, and the above-described third conduction layer CL3 corresponds to the fourth metal layer ML4 in the second semiconductor die SD2.

The above-described vertical lines connecting the horizontal lines HL1, HL2 and HL4 in the polysilicon layer PL2 and the metal layers MB and ML4 may include vertical contacts VL1, VL2 and VL3 and through-silicon vias TSV1, TSV2, TSV3 and TSV4 penetrating the first and second semiconductor dies SD1 and SD2.

The two example embodiments of the defect detection structure using the conduction layers of the two semiconductor dies SD1 and SD2 are described with reference to FIGS. 26A and 26B. It would be easily understood that the defect detection structure, according to example embodiments, may be implemented using various combinations of conduction layers of three or more semiconductor dies.

Figure 27:
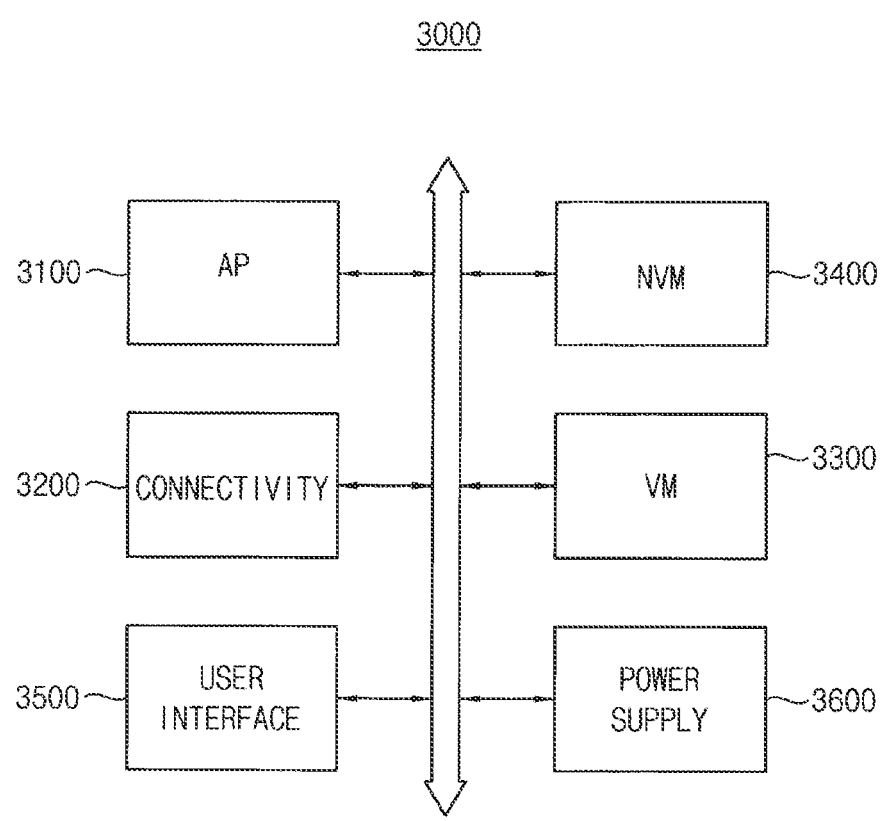
FIG. 27 is a block diagram illustrating a mobile system according to example embodiments.

FIG. 27 is a block diagram illustrating a mobile system according to example embodiments.

Referring to FIG. 27, a mobile system 3000 includes an application processor 3100, a connectivity unit 3200, a volatile memory device VM 3300, a nonvolatile memory device NVM 3400, a user interface 3500, and a power supply 3600 connected via a bus.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In example embodiments of the inventive concepts, the mobile system 3000 may further include a camera image processor (CIS), and/or a storage device, such as a memory card, a solid state drive (SSD), a hard disk drive (HDD), a compact disc read only memory (CD-ROM), etc.

The volatile memory device 3300 and/or the nonvolatile memory device 3400 may be implemented as a semiconductor device including the defect detection structure CDST as described above. The defect detection structure CDST includes a first conduction loop, a second conduction loop, a third conduction loop and a fourth conduction loop. The first conduction loop passes through a left-bottom corner region CLB of the peripheral region PREG. The second conduction loop passes through a right-bottom corner region CRB of the peripheral region PREG. The third conduction loop passes through the left-bottom corner region CLB and a left-upper corner region CLU of the peripheral region PREG. The fourth conduction loop passes through the right-bottom corner region CRB and a right-upper corner region CRU of the peripheral region PREG.

As described above, the defect detection structure, the semiconductor device and the associated method according to example embodiments may detect crack penetration of various types accurately using the plurality of conduction loops formed in the peripheral region surrounding the central region in which the semiconductor integrated circuit is formed. The defect detection structure, the semiconductor device and the associated method according to example embodiments may prevent yield of bad products with enhanced detectability of the crack.

The present inventive concept may be applied to any electronic devices and systems formed using semiconductor dies. For example, the defect detection structure CDST according to example embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of detecting defects in a semiconductor die including a central region and a peripheral region surrounding the central region, the peripheral region including a left-bottom corner region, a left-upper corner region, a right-upper corner region and a right-bottom corner region, the method comprising:
    forming a defect detection structure in the peripheral region, the defect detection structure comprising a first conduction loop in the left-bottom corner region, a second conduction loop in the right-bottom corner region, a third conduction loop in the left-bottom corner region and the left-upper corner region and a fourth conduction loop in the right-bottom corner region and the right-upper corner region;
    applying a test input signal to an input end node of the defect detection structure;
    receiving respective first, second, third, and fourth test output signals from first, second, third, and fourth output end nodes of the first, second, third and fourth conduction loops; and
    determining existence of defects in the semiconductor die and locations of the defects based on the test input signal and the first, second, third, and fourth test output signals,
    wherein the first, second, third and fourth conduction loops are connected to the input end node at respective opposite ends of the first, second, third and fourth conduction loops from respective ones of the first, second, third, and fourth output end nodes.

2. The method of claim 1, wherein the input end node and the first, second, third and fourth output end nodes are in an end node region between the left-bottom corner region and the right-bottom corner region.

3. The method of claim 2, wherein the input end node and the first, second, third and fourth output end nodes are directly and electrically connected to an input-output circuit.

4. The method of claim 1, wherein the first, second, third and fourth conduction loops are connected commonly to the input end node that is at an opposite end of the first, second, third and fourth conduction loops from the first, second, third and fourth output end nodes.

5. The method of claim 1, wherein the input end node is connected to a test input pad that is formed on a surface of the semiconductor die, and the test input signal is applied commonly to the first, second, third and fourth conduction loops through the test input pad.

6. The method of claim 1, wherein the first, second, third, and fourth test output signals are provided sequentially through one output pad.

7. The method of claim 1, wherein the first, second, third and fourth output end nodes are sequentially connected, via a selection circuit, to one output pad that is formed on a surface of the semiconductor die.

8. The method of claim 1, wherein at least two of the first, second, third, and fourth test output signals are provided in parallel through at least two output pads.

9. The method of claim 1, wherein at least two of the first, second, third and fourth output end nodes are connected respectively to at least two output pads that are formed on a surface of the semiconductor die.

10. The method of claim 1, wherein the locations of the defects are determined by comparing a delay time of the first test output signal and a delay time of the second test output signal.

11. The method of claim 1, wherein the locations of the defects are determined by comparing a delay time of the third test output signal and a delay time of the fourth test output signal.

12. The method of claim 1, wherein first, second, third and fourth delay times are measured by comparing a phase of the test input signal with phases of the first, second, third and fourth test output signals, and the existence of the defects and the locations of the defects are determined based on the first, second, third and fourth delay times.

13. The method of claim 12, wherein the existence of the defects and the locations of the defects are determined by comparing the first, second, third and fourth delay times with a reference value.

14. The method of claim 13, wherein the existence of the defects and the locations of the defects are determined by comparing mutually the first, second, third and fourth delay times.

15. The method of claim 1, wherein the defect detection structure comprises a ring-shaped three-dimensional structure surrounding the central region.

16. The method of claim 1, wherein the first conduction loop and the second conduction loop are formed using a first conduction layer and a second conduction layer, and the third conduction loop and the fourth conduction loop are formed using the first conduction layer and a third conduction layer.

17. The method of claim 1, wherein the first conduction loop and the second conduction loop are formed using a first conduction layer, and the third conduction loop and the fourth conduction loop are formed using the first conduction layer and a second conduction layer.

18. The method of claim 1, wherein the first conduction loop and the second conduction loop are formed using a first conduction layer, and the third conduction loop and the fourth conduction loop are formed using a second conduction layer.

19. A defect detection structure in a peripheral region of a semiconductor die surrounding a central region of the semiconductor die, the defect detection structure comprising:

a first conduction loop in a left-bottom corner region of the peripheral region;

a second conduction loop in a right-bottom corner region of the peripheral region;

a third conduction loop in the left-bottom corner region and a left-upper corner region of the peripheral region; and a fourth conduction loop in the right-bottom corner region and a right-upper corner region of the peripheral region, wherein the first conduction loop and the second conduction loop are formed using a first conduction layer and a second conduction layer, and the third conduction loop and the fourth conduction loop are formed using the first conduction layer and a third conduction layer, wherein an input end node of the defect detection structure is configured to receive a test input signal, wherein first, second, third, and fourth output end nodes of the first, second, third and fourth conduction loops are configured to output respective first, second, third, and fourth test output signals, wherein the first, second, third and fourth conduction loops are connected to the input end node at respective opposite ends of the first, second, third and fourth conduction loops from respective ones of the first, second, third, and fourth output end nodes of the first, second, third and fourth conduction loops.

20. A defect detection structure in a peripheral region of a semiconductor die surrounding a central region of the semiconductor die, the defect detection structure comprising:

a first conduction loop in a left-bottom corner region of the peripheral region;

a second conduction loop in a right-bottom corner region of the peripheral region;

a third conduction loop in the left-bottom corner region and a left-upper corner region of the peripheral region; and a fourth conduction loop in the right-bottom corner region and a right-upper corner region of the peripheral region, wherein the first conduction loop and the second conduction loop are formed using a first conduction layer, and the third conduction loop and the fourth conduction loop are formed using the first conduction layer and a second conduction layer, wherein an input end node of the defect detection structure is configured to receive a test input signal, wherein first, second, third, and fourth output end nodes of the first, second, third and fourth conduction loops are configured to output respective first, second, third, and fourth test output signals, wherein the first, second, third and fourth conduction loops are connected to the input end node at respective opposite ends of the first, second, third and fourth conduction loops from respective ones of the first, second, third, and fourth output end nodes of the first, second, third and fourth conduction loops.

* * * * *